(12) United States Patent
Nguyen et al.

(10) Patent No.: US 6,985,385 B2
(45) Date of Patent: Jan. 10, 2006

(54) MAGNETIC MEMORY ELEMENT UTILIZING SPIN TRANSFER SWITCHING AND STORING MULTIPLE BITS

(75) Inventors: Paul P. Nguyen, San Jose, CA (US); Yiming Huai, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 42 days.

(21) Appl. No.: 10/649,119

(22) Filed: Aug. 26, 2003

(65) Prior Publication Data

US 2005/0045913 A1    Mar. 3, 2005

(51) Int. Cl.
*G11C 11/15*    (2006.01)

(52) U.S. Cl. ............... 365/173; 365/171; 365/158; 365/225.5

(58) Field of Classification Search ........... 365/173, 365/171, 158, 225.5
See application file for complete search history.

(56) References Cited

U.S. PATENT DOCUMENTS

| | | | | |
|---|---|---|---|---|
| 5,930,164 | A | 7/1999 | Zhu ..................... | 365/158 |
| 6,418,048 | B1 * | 7/2002 | Sin et al. ............... | 365/173 |
| 6,532,164 | B2 | 3/2003 | Redon et al. ........... | 365/97 |
| 6,590,806 | B1 * | 7/2003 | Bhattacharyya ........ | 365/173 |
| 6,829,161 | B2 * | 12/2004 | Huai et al. ............ | 365/158 |
| 6,847,547 | B2 | 1/2005 | Albert et al. | |
| 6,847,574 | B2 * | 1/2005 | Santin .................. | 365/225.7 |
| 2002/0105827 | A1 | 8/2002 | Redon et al. .......... | 365/173 |
| 2003/0007398 | A1 | 1/2003 | Daughton et al. | |
| 2003/0059588 | A1 | 3/2003 | Hannah et al. ........ | 428/200 |

OTHER PUBLICATIONS

J.F. Albert, et al, "Polarized Current Switching of a CO Thin Film Nanomagnet", American Institute of Physics, vol. 77, No. 23, Dec. 4, 2000, pp. 3809-3811.

(Continued)

*Primary Examiner*—Richard Elms
*Assistant Examiner*—Toan Le
(74) *Attorney, Agent, or Firm*—Sawyer Law Group LLP

(57) ABSTRACT

A method and system for providing a magnetic element capable of storing multiple bits is disclosed. The method and system include providing first pinned layer, a first nonmagnetic layer, a first free layer, a connecting layer, a second pinned layer, a second nonmagetic layer and a second free layer. The first pinned layer is ferromagnetic and has a first pinned layer magnetization pinned in a first direction. The first nonmagnetic layer resides between the first pinned layer and the first free layer. The first free layer being ferromagnetic and has a first free layer magnetization. The second pinned layer is ferromagnetic and has a second pinned layer magnetization pinned in a second direction. The connecting layer resides between the second pinned layer and the first free layer. The second nonmagnetic layer resides between the second pinned layer and the second free layer. The second free layer being ferromagnetic and having a second free layer magnetization. The magnetic element is configured to allow the first free layer magnetization and the second free layer magnetization to change direction due to spin transfer when a write current is passed through the magnetic element.

56 Claims, 11 Drawing Sheets

OTHER PUBLICATIONS

J.A. Katine, et al, "Current-Driven Magnetization Reversal and Spin-Wave Excitations in Co/Cu/Co Pillars", the American Physical Society, vol. 84, No. 14, Apr. 3, 2000, pp. 3149-3151.

E.G. Myers, et al, "Point-Contact Studies of Current-Controlled Domain Switching in Magnetic Multilayers" Journal of Applied Physics, vol. 87, No. 9, May 1, 2000, pp. 5502-5503.

J.C. Slonczewski, "Theory and Application of Exchange-Driven Switching", IEEE, Apr. 2000, pp. CE-02.

J.C. Slonczewski, "Current-Driven Excitation of Magnetic Multilayers", Journal of Magnetism and Magnetic Materials, 1996, pp. 1.1-1.7.

J.C. Slonczewski, "Conductance and Exchange Coupling of Two Ferromagnets Separated by a Tunneling Barrier", The American Physical Society, vol. 39, No. 10, Apr. 1, 1999, pp. 6995-7002.

J.Z. Sun, "Current-Driven Magnetic Switching in Manganite Trilayer Junctions", Journal of Magnetism and Magnetic Materials, No. 202, 1999, pp. 157-162.

* cited by examiner

MAGNETIC MEMORY ELEMENT UTILIZING SPIN TRANSFER SWITCHING AND STORING MULTIPLE BITS

FIELD OF THE INVENTION

The present invention relates to magnetic systems, and more particularly to a method and system for providing a reduced-sized magnetic element, including but not limited to a magnetic element that employs a spin transfer effect in switching and that can be used in a magnetic memory such as magnetic random access memory ("MRAM").

BACKGROUND OF THE INVENTION

Various types of magnetic technology utilize magnetic elements for storing or reading data. For example, in conventional MRAM technology, the conventional magnetic element used is a spin tunneling junction. FIG. 1A depicts one such conventional magnetic element 10, which is a spin tunneling junction 10. The conventional spin tunneling junction 10 includes an antiferromagnetic (AFM) layer 12, a pinned layer 14, a barrier layer 16, and a free layer 18. The conventional pinned layer 14 is ferromagnetic and has a magnetization that is typically pinned by the AFM layer 12. As used herein, the term "ferromagnetic" includes ferromagnetic, ferrimagnetic, and sperimagnetic materials. The conventional ferromagnetic free layer 18 is separated from the pinned layer by the insulating barrier layer 16. The barrier layer 16 is sufficiently thin to allow tunneling of charge carriers between the pinned layer 14 and the free layer 18. Similarly, in conventional hard disk magnetic recording technology, the magnetic elements for magnetoresistive read heads include conventional magnetic elements, such as a spin valves. Spin valves have an analogous structure to the conventional spin tunneling junction 10. However, the barrier layer 16 is replaced by a conductive nonmagnetic spacer layer. Spin valves include a ferromagnetic pinned layer having a magnetization that is typically pinned by an AFM layer. The spin valve also includes a ferromagnetic free layer separated from the pinned layer by a conductive, nonmagnetic spacer layer, such as Cu. The ferromagnetic pinned and free layers of the spin tunneling junction and spin valve may also be synthetic.

In order to program the conventional spin tunneling junction 10, an external magnetic field is applied, typically by running a current through one or more write lines (not shown). In response to the magnetic field, the magnetization of the conventional free layer 18 aligns parallel or antiparallel to the magnetization of the conventional pinned layer 14. When the magnetic field is removed, the magnetization of the conventional free layer 18 remains in place. If the magnetization of the conventional free layer 18 is parallel to the magnetization of the conventional pinned layer 14, then the conventional spin tunneling junction 10 is in a low resistance state. If the magnetization of the conventional free layer 18 is antiparallel to the magnetization of the conventional pinned layer 14, then the conventional spin tunneling junction 10 is in a high resistance state. For example, suppose that when the magnetizations of the conventional free layer 18 and the conventional pinned layer 14 are parallel, the total resistance of the conventional magnetic element 10 is R−ΔR. Then, when the magnetizations of the conventional free layer 18 and the conventional pinned layer 14 are antiparallel, the resistance is R+ΔR. The conventional magnetic element 10 can thus be considered to have a median resistance of R. The median resistance is the resistance in the middle of the range of operation for the device. Based on these two states, R−ΔR and R+ΔR, one bit of information (corresponding to a zero or a one) is stored in the conventional spin tunneling junction 10.

In addition, other conventional magnetic elements build on the conventional spin tunneling junction 10. For example, a dual conventional spin tunneling junction could be used. In such a conventional magnetic element, a second pinned layer and a second barrier layer between the second pinned layer and the free layer 18 could be provided. Other conventional magnetic elements may use a conducting layer in lieu of a second barrier layer, as shown in FIG. 1B and FIG. 2. In such a case, the conventional magnetic element could be considered a combination of a spin valve and a spin tunneling junction which share a common free layer.

FIG. 2 depicts another conventional magnetic element 20 capable of storing multiple bits of data. The magnetic element 20 includes two spin tunneling junctions 30 and 40 separated by a conductive layer 22. The spin tunneling junction 30 includes a pinned layer 32 and a free layer 36 separated by a barrier layer 34. Similarly, the spin tunneling junction 40 includes a pinned layer 42 and a free layer 46 separated by a barrier layer 44. For clarity, AFM layers are not depicted. However, AFM layers are typically used to pin the magnetizations of the pinned layers 32 and 42. The conductive layer 22 electrically connects the spin tunneling junctions 30 and 40. The conventional free layers 36 and 46 are configured such that the magnetization of the conventional free layer 36 will change direction at a different magnetic field than the magnetization of the conventional free layer 46. This is typically accomplished by ensuring that the conventional free layers 36 and 46 have different thicknesses. In addition, the barrier layers 34 and 44 have different thicknesses so that the conventional spin tunneling junctions have different resistances.

In order to program the conventional magnetic element 20, external magnetic fields are applied, typically using current driven through one or more write lines (not shown). For the purposes of explanation, assume that the coercivity of the conventional free layer 36 is H1, while the coercivity of the conventional free layer 46 is H2. Also assume that H1 is less than H2. If a "00" is stored, a magnetic field, H, greater than H1 and H2 in a first direction, for example parallel to the direction of magnetization of the conventional pinned layer 32, is always applied first. Thus, the magnetizations of the conventional free layers 36 and 46 are parallel. In addition, the magnetizations of the conventional free layers 36 and 46 are both parallel to the magnetizations of the pinned layers 32 and 42. If a "10" is desired, then H is applied in the same direction and removed. A second field is then applied. The magnitude of the second field is between H1 and H2. The direction of the second field is opposite to the direction of H and, therefore, antiparallel to the magnetizations of the conventional pinned layers 32 and 42. Consequently, the magnetization of the conventional free layer 36 is antiparallel to the magnetization of the conventional pinned layer 32, while the magnetization of the conventional free layer 46 is parallel to the magnetization of the conventional pinned layer 42. If a "01" is desired, then H is first applied in the opposite direction, antiparallel to the magnetizations of the conventional pinned layers 32 and 42. The field is then removed. A field between H1 and H2 parallel to the magnetizations of the conventional pinned layers 32 and 43 is then provided. As a result, the magnetization of the conventional free layer 36 will be oriented parallel to the magnetization of the conventional pinned layer 32, while the magnetization of the conventional free layer 46 is oriented antiparallel to the magnetization of the conventional pinned layer 42. If a "11" is desired, then H is applied in the direction antiparallel to magnetizations of the conventional pinned layers 32 and 42. Thus, two bits corresponding to "00", "01", "10" and "11" are stored in the magnetic element 50.

The states "00", "01", "10", and "11" correspond to different resistances. The resistance of the spin tunneling junction 30 is R1−ΔR1 when the magnetizations of the free layer 36 and pinned layer 32 are aligned or R1+ΔR1 when the magnetizations of the free layer 36 and pinned layer 32 are antiparallel. R1 can be considered to be the median resistance of the spin tunneling junction 30, and ΔR1 the change from the median resistance to one of the stable states (magnetizations parallel or antiparallel). The resistance of the spin tunneling junction 40 is R2−ΔR2 when the magnetizations of the free layer 46 and pinned layer 42 are aligned in parallel. The resistance of the spin tunneling junction 40 is R1+ΔR1 when the magnetizations of the free layer 46 and pinned layer 42 are antiparallel. R2 can be considered to be the median resistance of the spin tunneling junction 40, and ΔR2 the change from the median resistance to one of the stable states (magnetizations parallel or antiparallel). For the conventional magnetic element 20 to function as desired, R1 should be different from R2 and ΔR1 should be different from ΔR2. Thus, a "00" corresponds to the resistance R1−ΔR1+R2−ΔR2 for the conventional magnetic element 20. A "01" corresponds to the resistance R1−ΔR1+R2+ΔR2 for the conventional magnetic element 20. A "10" corresponds to the resistance to the resistance R1+ΔR1+R2−ΔR2 for the conventional magnetic element 20. A "11" corresponds to the resistance to the resistance R1+ΔR1+R2+ΔR2 for the conventional magnetic element 20.

Although a conventional magnetic memory using the conventional magnetic elements 10 and 20 using the conventional spin tunneling junction can function, one of ordinary skill in the art will readily recognize that there are barriers to the use of the conventional magnetic elements 10 and 20 at higher memory cell densities. In particular, the conventional magnetic elements 10, 20 are written using an external magnetic field generated by currents driven through bit lines (not shown) and the write lines (not shown). In other words, the magnetizations of the free layers 18, 36, and 46 are switched by the external magnetic field generated by current driven through the bit line and the write line. The magnetic field required to switch the magnetizations of the free layers 18, 36, and 46 known as the switching field, is inversely proportional to the width of the conventional magnetic elements 10 and 20. As a result, the switching field increases for conventional memories having smaller conventional magnetic elements 10 and 20. Because the switching field is higher, the current required to be driven through the bit line and particularly through the write line increases dramatically for higher magnetic memory cell density. This large current can cause a host of problems in the conventional magnetic memories using the conventional magnetic elements 10 or 20. For example, cross talk and power consumption would increase. In addition, the driving circuits required to drive the current that generates the switching field at the desired conventional memory element 10 or 20 would also increase in area and complexity. Furthermore, the conventional write currents have to be large enough to switch a magnetic memory cell but not so large that the neighboring cells are inadvertently switched. This upper limit on the write current amplitude can lead to reliability issues because the cells that are harder to switch than others (due to fabrication and material nonuniformity) will fail to write consistently.

Accordingly, what is needed is a system and method for providing a magnetic memory element which can be used in a memory array of high density, low power consumption, low cross talk, and high reliability, while providing sufficient read signal. The present invention addresses the need for such a magnetic memory element.

SUMMARY OF THE INVENTION

The present invention provides a method and system for providing a magnetic element capable of storing multiple bits. The method and system comprise providing a first pinned layer, a first nonmagnetic layer, a first free layer, a connecting layer, a second pinned layer, a second nonmagnetic layer, and a second free layer. The first pinned layer is ferromagnetic and has a first pinned layer magnetization pinned in a first direction. The first nonmagnetic layer resides between the first pinned layer and the first free layer. The first free layer being ferromagnetic and has a first free layer magnetization. The second pinned layer is ferromagnetic and has a second pinned layer magnetization pinned in a second direction. The connecting layer resides between the second pinned layer and the first free layer. The second nonmagnetic layer resides between the second pinned layer and the second free layer. The second free layer is ferromagnetic and has a second free layer magnetization. The first and second nonmagnetic layers may be insulating barrier layers, or they may be conducting metal layers. In a preferred embodiment, the first and second nonmagnetic layers are conductive layers. In the preferred embodiment, the magnetic element also includes a first barrier layer, a second barrier layer, a third pinned layer and a fourth pinned layer. In such an embodiment, the first barrier layer resides between the first free layer and the third pinned layer. The second barrier layer resides between the second free layer and the fourth pinned layer. Also in the preferred embodiment, a pinned layer's magnetization is pinned by an adjacent antiferromagnetic layer and the connecting layer is a shared antiferromagnetic layer. Alternatively, to reduce stack height, a pinned layer and its adjacent (or shared) pinning AFM layer can be replaced by an antiferromagnetically coupled hard magnetic layer/Ru/hard magnetic layer or hard magnetic layer/Ru/soft magnetic layer three-layer structure, where "hard" and "soft" refer to ferromagnetic layers with high and low magnetic anisotropies, respectively. The soft layer may be Co, Fe, Ni and their alloys; and the hard layer can be hard-magnet materials such as CoCrPt. The magnetic element is configured to allow the first free layer magnetization and the second free layer magnetization to change direction due to spin transfer when a write current is passed through the magnetic element.

According to the system and method disclosed herein, the present invention provides a magnetic element capable of storing multiple bits and being written using spin transfer switching, which is more localized than the field switching mechanism.

DETAILED DESCRIPTION OF THE INVENTION

Figure 1A:
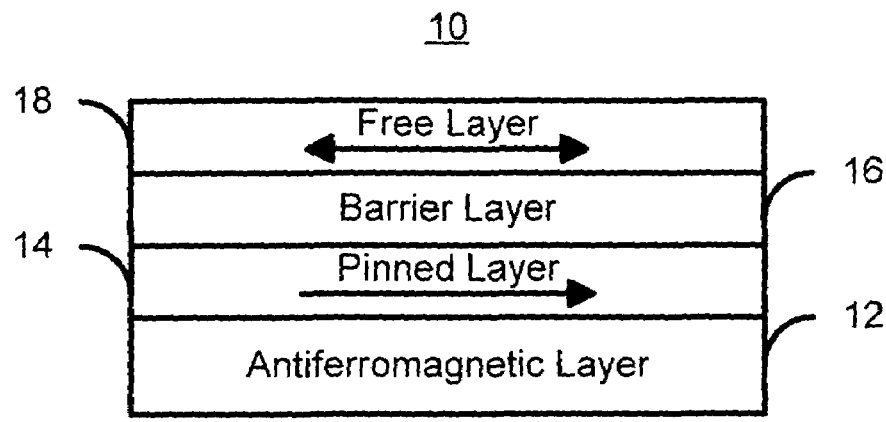
FIG. 1A depicts a conventional magnetic element used in a conventional magnetic memory.

The present invention relates to an improvement in magnetic elements. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Conventional magnetic storage technology increasingly utilizes magnetic elements, such spin valves and spin tunneling junctions, that have a smaller size. However, manufacturing and operating such elements using conventional methods is difficult. A more recently discovered phenomenon, known as spin transfer, is of interest in magnetic storage technology. Current knowledge of spin transfer is described in detail in J. C. Slonczewski, "Current-driven Excitation of Magnetic Multilayers," *Journal of Magnetism and Magnetic Materials*, vol. 159, p. L1–L5 (1996); L. Berger, "Emission of Spin Waves by a Magnetic Multilayer Traversed by a Current," *Phys. Rev. B*, Vol. 54, p. 9353 (1996), and in F. J. Albert, J. A. Katine and R. A. Buhman, "Spin-polarized Current Switching of a Co Thin Film Nanomagnet," *Appl. Phys. Lett.*, vol. 77, No. 23, p. 3809–3811 (2000). Thus, the following description of the spin transfer phenomenon is based upon current knowledge in the area and is not intended to limit the scope of the invention.

The spin-transfer effect arises from the spin-dependent electron transport properties of ferromagnetic-normal metal multilayers. When a spin-polarized current traverses a magnetic multilayer in a current perpendicular to the plane (CPP) configuration, the spin angular momentum of electrons incident on a ferromagnetic layer interacts with magnetic moments of the ferromagnetic layer. Through this interaction, the electrons transfer a portion of their angular momentum to the ferromagnetic layer. As a result, a spin-polarized current can switch the magnetization direction of the ferromagnetic layer if the current density is sufficiently high (approximately $10^7$–$10^8$ A/cm$^2$), and if the dimensions of the multilayer are small (approximately less than two hundred nanometers) so that self field effects are not important. In addition, for spin transfer to be able to switch the magnetization direction of a ferromagnetic layer, the ferromagnetic layer must be sufficiently thin, for instance, preferably less than approximately ten nanometers for Co.

The phenomenon of spin transfer can be used in the CPP configuration as an alternative to or in addition to using an external switching field to switch the direction of magnetization of the free layer of conventional spin valves or the conventional spin tunneling junctions. Spin transfer is a phenomenon which dominates other mechanisms and thus becomes observable when the dimensions of the conventional magnetic element are small, in the range of few hundred nanometers. In contrast to the application of an external field, the spin transfer phenomenon is a localized phenomenon. Thus, spin transfer may be used to write to magnetic elements in higher density magnetic memories having smaller magnetic elements.

One of ordinary skill in the art will readily recognize that there are barriers to using the phenomenon of spin transfer to write to conventional magnetic elements, such as spin valves or spin tunneling junctions. For the conventional spin valve, the CPP configuration results in a significantly reduced signal. Although a conventional spin tunneling junction may have a larger signal due to is larger resistance, the high current density required to induce the spin-transfer effect could destroy thin insulating barrier due to ohmic dissipation.

As described above, other conventional magnetic elements have been proposed in varying degrees of specificity and, in some cases, utilized. Such conventional magnetic elements include dual spin valves, dual spin tunneling junctions and combinations of spin valves and spin tunneling junctions.

Figure 1B:
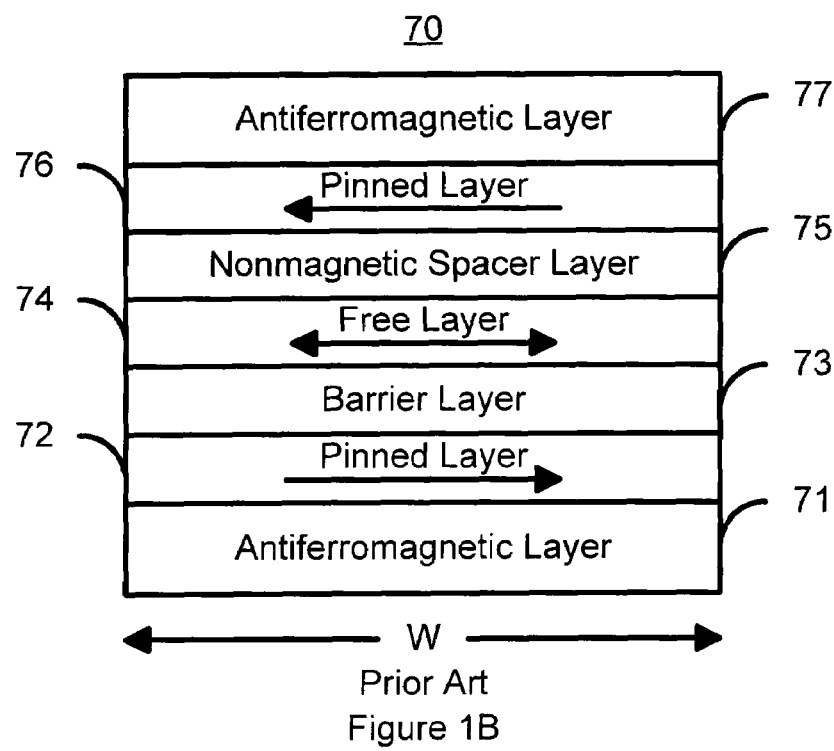
FIG. 1B is a diagram of one embodiment of a dual spin tunnel/valve structure used as a magnetic element.

FIG. 1B is a diagram of one embodiment of a magnetic element termed a dual spin tunnel/valve structure 70 that can be used as a magnetic element. The dual spin tunnel/valve structure 70 is preferably fabricated upon the appropriate seed layer. The dual spin tunnel/valve structure 70 includes an antiferromagnetic (AFM) layer 71 upon which a pinned layer 72 is fabricated. The pinned layer 72 is ferromagnetic and has its magnetization pinned by the AFM layer 71. The dual spin tunnel/valve structure 70 also includes a barrier layer 73 that is insulating and is thin enough to allow charge carriers to tunnel between the pinned layer 72 and the free layer 74. The free layer 74 is ferromagnetic and has a magnetization that can be changed due to the spin transfer phenomenon. The dual spin tunnel/valve structure 70 also includes a nonmagnetic spacer layer 75 that is conductive and can include materials such as Cu. The dual spin tunnel/valve structure 70 includes a second pinned layer 76 that is ferromagnetic and has a magnetization that is pinned by the AFM layer 77. The dual spin tunnel/valve structure 70 can be considered to be made up of a spin tunneling junction (including layers 71, 72, 73 and 74) and a spin valve (including layers 74, 75, 76, and 77), which share a free layer. Consequently, a higher read signal can be achieved while allowing writing using spin transfer. Although described as single ferromagnetic films, the layers 72, 74 and 76 may be synthetic, and/or may be doped to improve the thermal stability of the dual spin tunnel/valve structure 70. In addition, other magnetic elements having free layers that are magnetostatically coupled, including dual spin tunnel/valve structures, having magnetostatically coupled free layers have been described. Consequently, other structures using magnetic elements such as spin tunneling junctions or dual spin tunnel/valve structures can also be provided.

Figure 2:
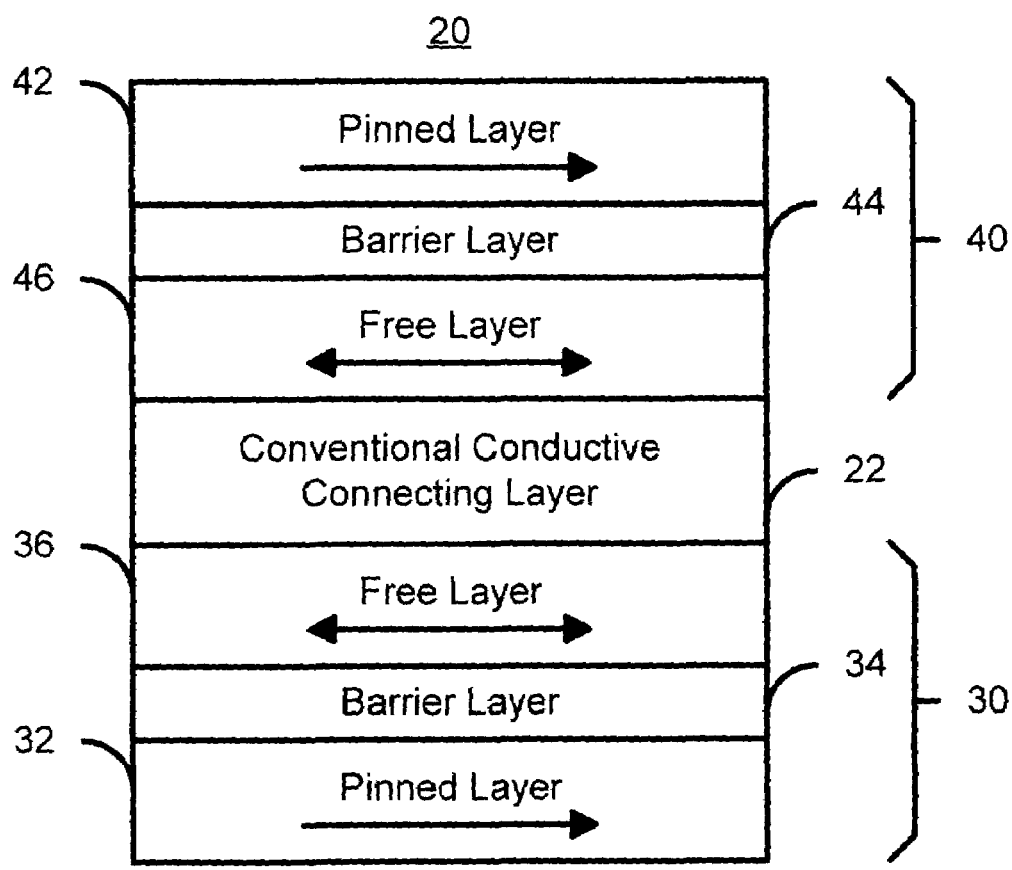
FIG. 2 depicts another conventional magnetic element capable of storing multiple bits used in a conventional magnetic memory.

The dual spin tunnel/valve structure 70 is configured to allow the magnetization of the free layer 74 to be switched using spin transfer. Consequently, the dimensions of the dual spin tunnel/valve structure 70 are preferably small, in the range of few hundred nanometers to reduce the self field effect. In a preferred embodiment, the dimensions of the dual spin tunnel/valve structure 70 are less than two hundred nanometers and preferably approximately one hundred nanometers. The dual spin tunnel/valve structure 70 preferably has a depth, perpendicular to the plane of the page in FIG. 2, of approximately fifty nanometers. The depth is preferably smaller than the width of the dual spin tunnel/valve structure 70 so that the dual spin tunnel/valve structure 70 has some shape anisotropy, ensuring that the free layer 74 has a preferred direction. In addition, the thickness of the free layer 74 is low enough so that the spin transfer is strong enough to rotate the free layer magnetization into alignment with the magnetizations of the pinned layers 72 and 76. In a preferred embodiment, the free layer 74 has a thickness of less than or equal to 10 nm. In addition, for a dual spin tunnel/valve structure 70 having the preferred dimensions, a sufficient current density on the order of $10^7$ Amps/cm$^2$ can be provided at a relatively small current. For example, a current density of approximately $10^7$ Amps/cm$^2$ can be provided with a current of approximately 0.5 mA for a dual spin tunnel/valve structure 70 having an ellipsoidal shape of 0.06×0.12 $\mu$m$^2$. As a result, the use of special circuitry for delivering very high currents may be avoided.

Although the magnetic elements discussed above may function well for their intended purpose, one of ordinary skill in the art will also recognize that it is desirable to use these magnetic elements in higher density memories.

The present invention provides a method and system for providing a magnetic element capable of storing multiple bits. The method and system comprise providing first pinned layer, a first nonmagnetic layer (which is electrically conducting), a first free layer, a connecting layer, a second pinned layer, a second nonmagnetic layer, and a second free layer. The first pinned layer is ferromagnetic and has a first pinned layer magnetization pinned in a first direction. The first nonmagnetic layer resides between the first pinned layer and the first free layer. The first free layer being ferromagnetic and has a first free layer magnetization. The second pinned layer is ferromagnetic and has a second pinned layer magnetization pinned in a second direction. The connecting layer resides between the second pinned layer and the first free layer. The second nonmagnetic layer resides between the second pinned layer and the second free layer. The second free layer being ferromagnetic and having a second free layer magnetization. The magnetic element is configured to allow the first free layer magnetization and the second free layer magnetization to change direction due to spin transfer when a write current is passed through the magnetic element.

The present invention will be described in terms of a particular magnetic element having certain components and a certain number of structures. However, one of ordinary skill in the art will readily recognize that this method and system will operate effectively for other magnetic memory elements having different and/or additional components or structures, such as another number of spin valves, spin tunneling junctions, and/or dual spin tunnel/valve structures. The present invention is also consistent with other magnetic memories having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. For example, the present invention is consistent with top and bottom spin valves as well as a top and bottom spin tunneling junction. In addition, the method and system are described in the context of certain layers being synthetic. However, one of ordinary skill in the art will readily recognize that other and/or additional layers could be synthetic. In addition, the present invention is consistent with magnetic elements having simple and/or synthetic ferromagnetic layers. Furthermore, although embodiments of the method in accordance with the present invention are described in the context of providing a single magnetic element, one of ordinary skill in the art will readily recognize that the method is consistent with providing multiple magnetic elements, for example in an array. The present invention is also described in the context of write currents being applied in particular directions, write currents having particular magnitudes, and a particular number of write currents being applied. However, one of ordinary skill in the art will readily recognize that the present invention is consistent with other and/or different write currents. The present invention is also described in the context of magnetizations having particular orientations between layers. One of ordinary skill in the art will, however, readily recognize that the present invention is consistent with other orientations.

Figure 3A:
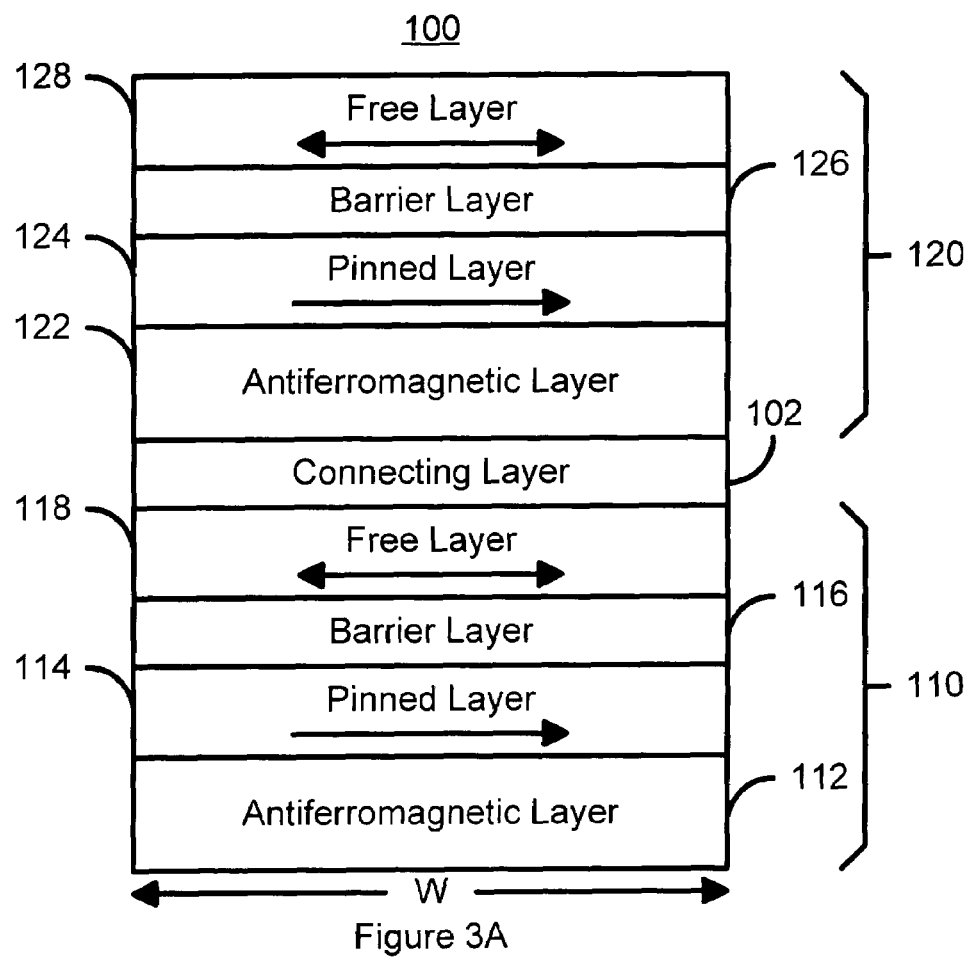
FIG. 3A is a diagram of one embodiment of a magnetic element in accordance with the present invention capable of storing multiple bits and utilizing the spin transfer phenomenon for writing.

To more particularly illustrate the method and system in accordance with the present invention, refer now to FIG. 3A depicting one embodiment of a magnetic element 100 in accordance with the present invention capable of storing multiple bits and utilizing the spin transfer phenomenon for writing. The magnetic element 100 includes two spin tunneling junctions 110 and 120 that are configured to be written using the spin transfer phenomenon and that are separated by a connecting layer 102.

The spin tunneling junction 110 includes a free layer 118, a nonmagnetic layer that is preferably a barrier layer 116, and a pinned layer 114. The free layer 118 and pinned layer 114 are ferromagnetic. The magnetization of the pinned layer 114 is pinned in a particular direction. Preferably, the spin tunneling junction 110 includes an AFM layer 112 that pins the magnetization of the pinned layer 114. However, in an alternate embodiment, the magnetization of the pinned layer 114 can be pinned in another fashion. The barrier layer 116 is configured to allow charge carriers to tunnel between the pinned layer 114 and the free layer 118. The spin tunneling junction 120 includes a free layer 128, a nonmagnetic layer that is preferably a barrier layer 126, and a pinned layer 124. The free layer 128 and pinned layer 124 are ferromagnetic. The magnetization of the pinned layer 124 is pinned in a particular direction. Preferably, the spin tunneling junction 120 includes an AFM layer 122 that pins the magnetization of the pinned layer 124. However, in an alternate embodiment, the magnetization of the pinned layer 124 can be pinned in another fashion. The barrier layer 126 is configured to allow charge carriers to tunnel between the pinned layer 124 and the free layer 128. The pinned layers 118 and 128 are preferably pinned in the directions shown in FIG. 3A.

Because they are configured to be written using the spin transfer phenomenon, the dimensions of the spin tunneling junctions 110 and 120 are preferably analogous to those of the dual spin tunnel/valve structure 70. Consequently, the dimensions of the spin tunneling junctions 110 and 120 are preferably small, in the range of few hundred nanometers. In a preferred embodiment, the dimensions of the spin tunneling junctions 110 and 120 are less than two hundred nanometers and preferably approximately one hundred nanometers. The spin tunneling junctions 110 and 120 preferably has a depth, perpendicular to the plane of the page in FIG. 3, of approximately fifty nanometers. The depth is preferably smaller than the widths of the spin tunneling junctions 110 and 120 so that the spin tunneling junctions 110 and 120 have some shape anisotropy, ensuring that the free layers 118 and 128 have a preferred direction. In addition, the thicknesses of the free layers 118 and 128 are low enough so that the spin transfer is strong enough to rotate the free layer magnetizations into alignment with the magnetizations of the pinned layers 114 and 124. In a preferred embodiment, the free layers 118 and 128 have thicknesses of less than or equal to 10 nm. In addition, for the spin tunneling junctions 110 and 120 having the preferred dimensions, a sufficient current density on the order of $10^7$ Amps/cm$^2$ can be provided at a relatively small current. For example, a current density of approximately $10^7$ Amps/cm$^2$ can be provided with a current of approximately 0.5 mA for spin tunneling junctions 110 and 120 having an ellipsoidal shape of 0.06×0.12 $\mu$m$^2$. As a result, the use of special circuitry for delivering very high currents may be avoided.

In operation, data can be written to the spin tunneling junction 110 using a current I1F in a forward direction from the top of the magnetic element 100 to the bottom of the magnetic element 100 and a current I1R in a reverse direction from the bottom of the magnetic element 100 to the top of the magnetic element 100. When the current I1F is applied in the forward direction, majority electrons travel from the pinned layer 114 to the free layer 118 (opposite to the direction of the current I1F because electrons are negatively charged). Majority electrons have their spins parallel to the magnetization of the pinned layer 114. The majority electrons can transfer their angular momentum to the free layer 118 via spin transfer. When a current I1F is provided, a sufficient number of majority electrons transfer their angular momentum to align the magnetization of the free layer 118 with the magnetization of the pinned layer 114. When the current I1R is applied in the reverse direction, minority electrons traveling from the free layer 118 to the pinned layer 114 (opposite to the direction of current I1R) are reflected from the pinned layer 114. The minority electrons have their angular momentum in a direction opposite to the magnetization of the pinned layer 114. When a current I1R is provided, a sufficient number of minority electrons transfer their angular momentum to align the magnetization of the free layer 118 antiparallel to the magnetization of the pinned layer 114.

Similarly, the spin tunneling junction 120 is written using a current I2F in a forward direction from the top of the magnetic element 100 to the bottom of the magnetic element 100 and a current I2R in a reverse direction from the bottom of the magnetic element 100 to the top of the magnetic element 100. Spin transfer can orient the magnetization of the free layer 128 in a manner analogous to what is described above. In a preferred embodiment, I1F is greater than I2F and I1R is greater than I2R. Differences in the resistances and write currents for the magnetic elements 10 and 120 can be achieved by tailoring of the layers in the magnetic elements 110 and 120. For example, the free layer 118 and 128 could have different thicknesses. Similarly, the barrier layers 116 and 126 could have different thicknesses.

In addition to being configured to be written using spin transfer, the spin tunneling junctions 110 and 120 are preferably configured to have different median resistances and to be written using different currents. For example, the median resistances of the spin tunneling junctions 110 and 120 are R1 and R2, respectively. The resistance of the spin tunneling junction 110 is R1−ΔR1 and R1+ΔR1 when the magnetizations of the free layer 118 and pinned layer 114 are parallel and antiparallel, respectively. The resistance of the spin tunneling junction 120 is R2−ΔR2 and R2+ΔR2 when the magnetizations of the free layer 128 and pinned layer 124 are parallel and antiparallel, respectively. In a preferred embodiment, R1, ΔR1, R2 and ΔR2 are different such that the four different states of the magnetic element 100 can be differentiated.

A connecting layer 102 resides between the spin tunneling junction 110 and the spin tunneling junction 120. The connecting layer 102 is preferably conductive. Thus, a current passing through the magnetic element 100 in a CPP direction readily passes between the spin tunneling junctions 110 and 120. As a result, the same write current and read current used for one spin tunneling junction 110 can be used for the other spin tunneling junction 120.

Figure 3B:
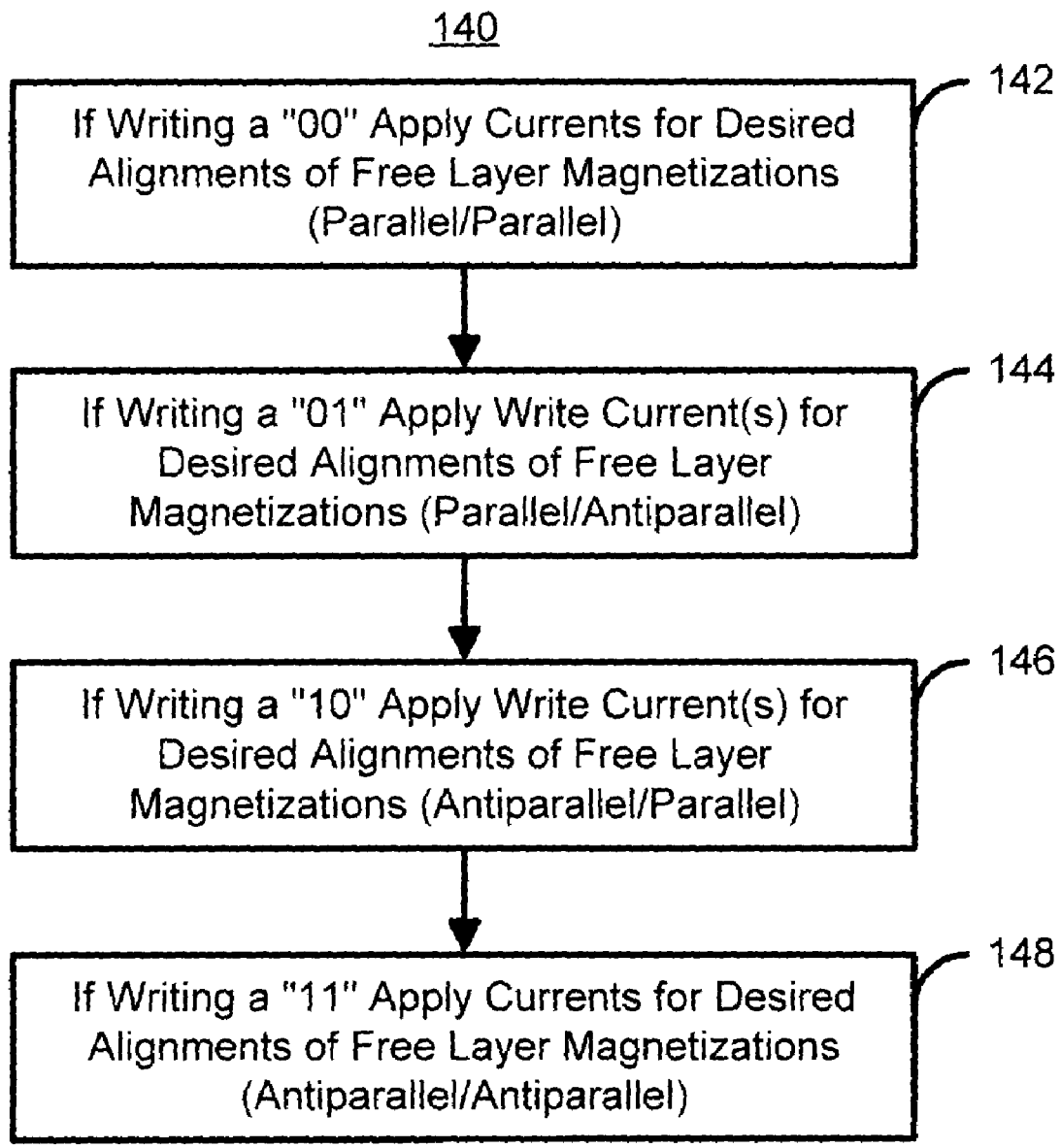
FIG. 3B is a high level flow chart depicting one embodiment of a method in accordance with the present invention for writing to a magnetic element capable of storing multiple bits and utilizing the spin transfer phenomenon for writing.

FIG. 3B is a high-level flow chart of one embodiment of a method 140 in accordance with the present invention for writing to a magnetic element capable of storing multiple bits and being written using spin transfer. The method 140 is described in the context of the magnetic element 100 depicted in FIG. 3A. Referring to FIGS. 3A and 3B, in writing to the magnetic element, the write current(s) used should ensure the desired alignment of the free layers 118 and 128. If a "00" is to be written, then at least one write current that aligns the magnetizations of the free layers 118 and 128 parallel to the magnetizations of the pinned layers 114 and 124 is applied to the magnetic element, via step 142. Step 142 could thus include providing a single write current that is greater than I1F and I2F in the forward direction through the magnetic element 100. If a "01" is to be written, then one or more write currents are applied that align the magnetization of the free layer 128 antiparallel to the magnetization of the pinned layer 124 and the magnetization of the free layer 118 parallel to the magnetization of the pinned layer 114, via step 144. If a "10" is to be written, then one or more write currents are applied that align the magnetization of the free layer 128 parallel to the magnetization of the pinned layer 124 and the magnetization of the free layer 118 antiparallel to the magnetization of the pinned layer 114, via step 146. If a "11" is to be written, then one or more write currents that align the magnetizations of the free layers 118 and 128 antiparallel to the magnetizations of the pinned layers 114 and 124, respectively, is applied, via step 148.

Figure 3C:
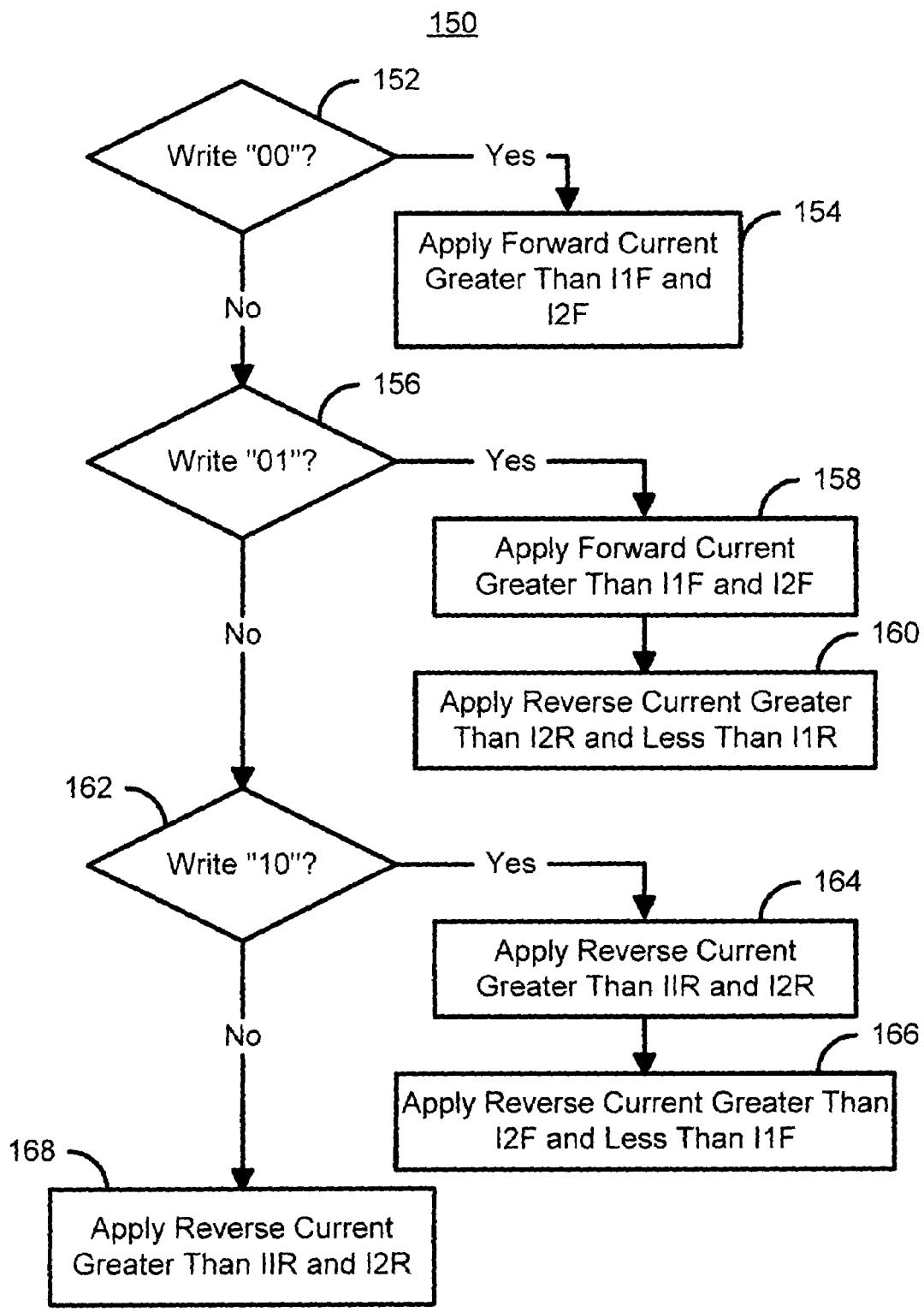
FIG. 3C is a more detailed flow chart depicting one embodiment of a method in accordance with the present invention for writing to a magnetic element capable of storing multiple bits and utilizing the spin transfer phenomenon for writing.

FIG. 3C depicts one embodiment of a method 150 in accordance with the present invention for writing to a magnetic element capable of storing multiple bits and being written using spin transfer. The method 150 is described in the context of the magnetic element 100 depicted in FIG. 3A. Referring to FIGS. 3A and 3C, in writing to the magnetic element, the write current(s) used should ensure the desired alignment of the free layers 118 and 128.

It is determined whether a "00" is to be written to the magnetic element 100, via step 152. If so, then a first write current is applied in the forward direction (toward the bottom of the page in FIG. 3A), via step 154. The first write current is greater than both I1F and I2F. As a result, spin transfer orients the free layers 118 and 128 to be parallel to the pinned layers 114 and 124, respectively. The resistance of the magnetic element 100 in this state is R1−ΔR1+R2−ΔR2.

If a "00" is not to be written, then it is determined whether a "01" is to be written, via step 156. If so, a write current that is greater than I1F and I2F is applied in the forward direction, via step 158. Preferably, this write current is equal to the first write current. Consequently, the free layers 118 and 128 are oriented to be parallel to the pinned layers 114 and 124, respectively. A second write current is then applied in the reverse direction (up in FIG. 3A), via step 160. The second write current is greater than I2R, but less than I1R. Consequently, spin transfer induced by the second write current flips the magnetization of the free layer 128 to be antiparallel to the magnetization of the pinned layer 124, while the magnetization of the free layer 118 remains parallel to the pinned layer 114. The resistance of the magnetic element 100 in this state is R1−ΔR1+R2+ΔR2.

If a "01" is not to be written, then it is determined whether a "10" is to be written, via step 162. If so, then the third write current is applied in the reverse direction, via step 164. Consequently, the free layers 118 and 128 are oriented to be antiparallel to the pinned layers 114 and 124, respectively. A fourth write current is then applied in the forward direction, via step 166. The fourth write current is greater than I2F, but less than I1F. Consequently, spin transfer induced by the second write current flips the magnetization of the free layer 128 to be parallel to the magnetization of the pinned layer 124, while the magnetization of the free layer 118 remains antiparallel to the magnetization of the pinned layer 124. The resistance of the magnetic element 100 in this state is R1+ΔR1+R2−ΔR2.

If a "10" is not to be written, a "11" is to be written. Consequently, a write current that is greater than I1R and I2R, and preferably equal to the third write current, is applied in the reverse direction, via step 170. The magnetizations of the free layer 118 and 128 are thus oriented antiparallel to the magnetizations of the pinned layers 114 and 124, respectively. The resistance of the magnetic element 100 in this state is R1+ΔR1+R2+ΔR2.

In order to read the magnetic element 100, a read current that is less than I1F, I2F, I2R, and I2R is provided. The read current is thus less than any of the write currents applied. The read current will, therefore, not change the data written to the magnetic element. The resistance of the magnetic element 100 can be determined based upon the read current and an output signal. Based upon the resistance of the magnetic element, the data stored—"00", "01", "10", or "11" can be determined. If the resistance is R1−ΔR1+R2−ΔR2, then a "00" is stored. If the resistance is R1−ΔR1+R2+ΔR2, then a "01" is stored. If the resistance is R1+ΔR1+R2−ΔR2, then a "10" is stored. If the resistance is R1+ΔR1+R2+ΔR2, then a "11" is stored.

Using the method 140 and/or 150, multiple bits can be stored in the magnetic element 100 using spin transfer. A switching field driven by an external current is unnecessary. Instead, a more localized and reliable phenomenon is used to write to the magnetic element 100, leading to less cross talk. In addition, for a magnetic element 100 having the preferred dimensions, a sufficient current density on the order of $10^7$ Amps/cm$^2$ can be provided at a relatively small current. For example, a current density of approximately $10^7$ Amps/cm$^2$ can be provided with a current of approximately 0.5 mA for a magnetic element having an ellipsoidal shape of 0.06×0.12 $\mu$m$^2$. As a result, the use special circuitry for delivering very high currents may be avoided. Furthermore, because multiple bits are stored in a single magnetic element 100, a high-density memory incorporating the magnetic element 100 (storing more bits per unit area) can be made.

Figure 4A:
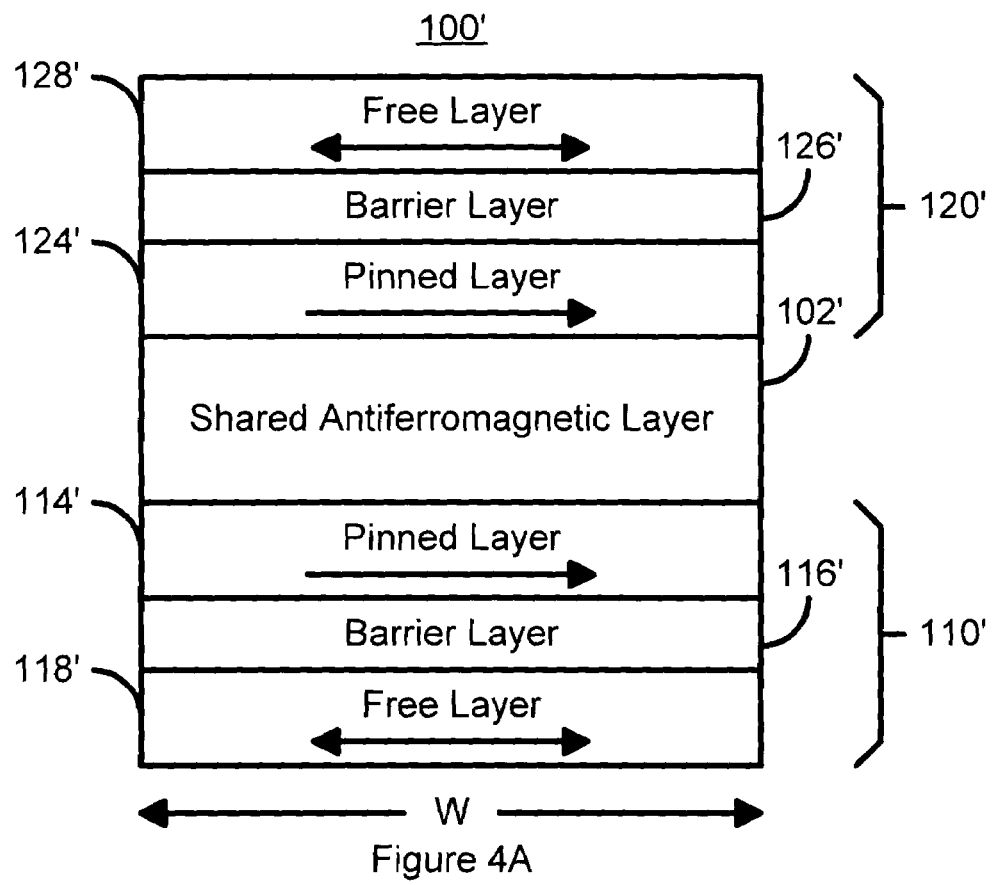
FIG. 4A is a diagram of a second embodiment of a magnetic element in accordance with the present invention capable of storing multiple bits and utilizing the spin transfer phenomenon for writing.
Figure 4B:
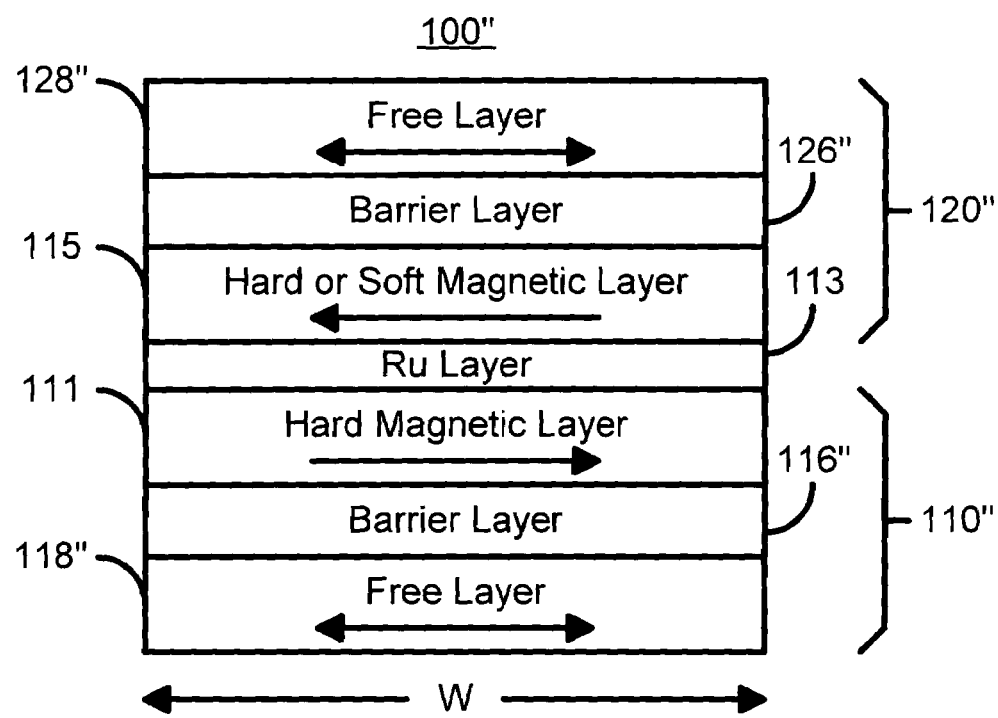
FIG. 4B is a diagram of an alternate version of the second embodiment of a magnetic element in accordance with the present invention capable of storing multiple bits and utilizing the spin transfer phenomenon for writing.

FIG. 4A is a diagram of a second embodiment of a magnetic element 100' in accordance with the present invention capable of storing multiple bits and utilizing the spin transfer phenomenon for writing. Many of the components of the magnetic element 100' are analogous to those of the magnetic element 100 depicted in FIG. 3A. Consequently, these components are labeled similarly. For example, the magnetic element 100' includes spin tunneling junctions 110' and 120'. However, the connecting layer 102 has been replaced by shared AFM layer 102'. In addition, the AFM layers 112 and 122 have been omitted. Instead, the single shared AFM layer 102' functions as both a connecting layer (similar to the connecting layer 102) and a layer used to pin the magnetizations of the pinned layers 114' and 124' (similar to the AFM layers 102 and 112). Alternatively, to further reduce stack's height, the pinned layers 114' and 124' and pinning AFM layer 102' can be replaced by an antiferromagnetically coupled hard magnetic layer/Ru/hard magnetic layer or hard magnetic layer/Ru/soft magnetic layer three-layer structure, where "hard" and "soft" refer to ferromagnetic layers with high and low magnetic anisotropy, respectively. The soft layer can be Co, Fe, Ni and their alloys; and the hard layer can be hard-magnet materials such as CoCrPt. Such an alternate structure 100" is depicted in FIG. 4B. Referring to FIGS. 4A and 4B, components of the magnetic element 100" which are analogous to the magnetic element 100' are labeled similarly. For example, the magnetic element 100" includes free layers 128" and 118". However, hard magnetic layers 111, Ru layer 113 and hard or soft magnetic layer 115 are used in lieu of the pinned layers 114' and 124' and AFM layer 102' of the magnetic element 100'.

The magnetic elements 100' and 100" are also configured to be written using spin transfer and to store multiple bits.

Consequently, the magnetic elements 100' and 100" share many of the same qualities and may be written in substantially the same manner as the magnetic element 100. The methods 140 and 150 depicted in FIGS. 3B and 3C, respectively, can thus be used to write data to the magnetic elements 100' and 100" depicted in FIGS. 4A and 4B. Because a current driven through the magnetic elements 100' and 100" can be used to write data using spin transfer, a switching field driven by an external current is unnecessary. Instead, a more localized and reliable phenomenon is used to write to the magnetic elements 100' and 100". In addition, for magnetic elements 100' and 100" having the preferred dimensions, a sufficient current density on the order of $10^7$ Amps/cm$^2$ can be provided at a relatively small current. For example, a current density of approximately $10^7$ Amps/cm$^2$ can be provided with a current of approximately 0.5 mA for a magnetic element having an ellipsoidal shape of 0.06×0.12 $\mu$m$^2$. As a result, the use of special circuitry for delivering very high currents may be avoided. Furthermore, because multiple bits are stored in a single magnetic element 100' or 100", a high-density memory (storing more bits per unit area) incorporating the magnetic element 100' or 100" can be fabricated. In addition, because the magnetic elements 100' uses a single shared AFM layer 102' to connect the spin tunneling junctions 110' and 120', separate AFM layers can be omitted. Similarly, because of the use of the layers 111, 113, and 115, the additional AFM layers are omitted in the magnetic element 100". As a result, the magnetic elements 100' and 100" can have a reduced stack height. A reduced stack height can make the magnetic elements 100' and 100" easier to pattern and simpler to fabricate.

Figure 5A:
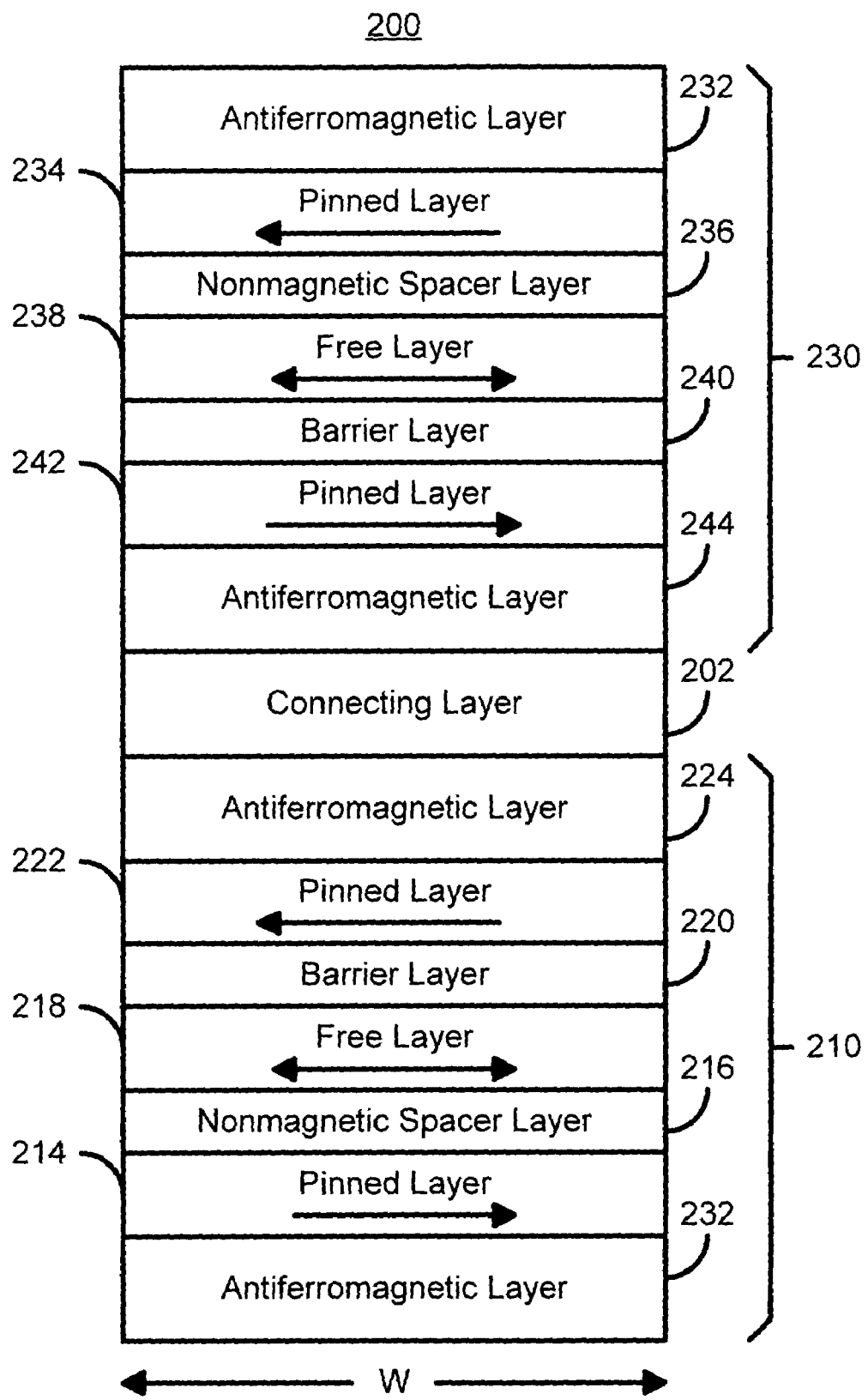
FIG. 5A is a diagram of a third embodiment of a magnetic element in accordance with the present invention capable of storing multiple bits, utilizing the spin transfer phenomenon for writing, and utilizing a dual spin tunnel/valve structure.

FIG. 5A is a diagram of a third embodiment of a magnetic element 200 in accordance with the present invention capable of storing multiple bits, utilizing the spin transfer phenomenon for writing, and utilizing a dual spin tunnel/valve structure. The magnetic element 200 thus includes dual spin tunnel/valve structures 210 and 230 separated by a connecting layer 202. The dual spin tunnel/valve structure 210 includes a pinned layer 214, a nonmagnetic layer 216, a free layer 218, a barrier layer 220, and a pinned layer 222. The dual spin tunnel/valve structure 210 also preferably includes AFM layers 212 and 224 used to pin the magnetizations of the pinned layers 214 and 222, respectively. The dual spin tunnel/valve structure 230 includes a pinned layer 234, a nonmagnetic layer 236, a free layer 238, a barrier layer 240, and a pinned layer 242. The dual spin tunnel/valve structure 230 also preferably includes AFM layers 232 and 244 used to pin the magnetizations of the pinned layers 234 and 242, respectively. The pinned layers 214, and 242 have their magnetizations pinned in a first direction. The pinned layer 222 and 234 have their magnetizations pinned in a second direction, preferably antiparallel to the first direction. The second direction orientation can be achieved by several techniques. One technique is to use synthetic structures (not shown) for the pinned layers 222 and 234. Another technique is to use an AFM material for AFM layers 224 and 232 which is different (in setting temperature and field) from the AFM material for AFM layers 232 and 242. The magnetization orientation of pinned layers 222 and 234 can then, using a different AFM setting temperature and field, be set independently from the magnetization orientation of pinned layers 214 and 242. The free layers 218 and 238 preferably have a preferred direction, but are otherwise free to respond to transferred angular momentum due to spin transfer. The barrier layers 220 and 240 are insulators through which charge carriers can tunnel. The nonmagnetic spacer layers 216 and 236 are conductors. Each dual spin tunnel/valve structure 210 and 230 can be considered to have a spin valve portion and a spin tunnel portion. The spin tunneling junction portion of the dual spin tunnel/valve structure 210 includes the pinned layer 222, barrier layer 220 and free layer 218. The spin valve portion of the dual spin tunnel/valve structure 210 includes the pinned layer 214, the nonmagnetic spacer layer 216 and the free layer 218. Similarly, the spin tunneling junction portion of the dual spin tunnel/valve structure 230 includes the pinned layer 242, barrier layer 240 and free layer 238. The spin valve portion of the dual spin tunnel/valve structure 230 includes the pinned layer 234, the nonmagnetic spacer layer 236 and the free layer 238.

In operation, the dual spin tunnel/valve structures 210 and 230 are each configured to be written using spin transfer. Currently, the spin transfer phenomenon is predominantly provided using the spin valve portions of the dual spin tunnel/valve structures 210 and 230. For example, for a current driven in the forward direction, electrons traveling from the pinned layer 214 to the free layer 218 can transfer their angular momentum to the free layer 218. As a result, the magnetization of the free layer 218 may be aligned with the magnetization of the pinned layer 214. In addition, minority electrons reflecting off of the pinned layer 222 can aid in orienting the magnetization of the free layer 218 parallel to the magnetization of the pinned layer 214. Similarly, for a current driven in the reverse direction, minority electrons from the free layer 218 reflect off of the pinned layer 214. These minority electrons travel back to the free layer 218 and tend to align the magnetization of the free layer 218 antiparallel to the magnetization of the pinned layer 214. In addition, majority electrons from the pinned layer 222 can aid in orienting the magnetization of the free layer 218 antiparallel to the magnetization of the pinned layer 214. Thus, a current can be driven in the reverse direction from the pinned layer 214 through the free layer 218 and the pinned layer 222. The dual spin tunnel/valve structure 230 functions in an analogous manner.

Because they are configured to be written using the spin transfer phenomenon, the dimensions of the dual spin tunnel/valve structure 210 and 230 are preferably analogous to those of the dual spin tunnel/valve structure 70. The dimensions of the dual spin tunnel/valve structures 210 and 230 are preferably less than two hundred nanometers and preferably approximately one hundred nanometers. The dual spin tunnel/valve structures 210 and 230 have depths, perpendicular to the plane of the page in FIG. 5A, of approximately fifty nanometers. The depth is preferably smaller than the widths of the dual spin tunnel/valve structures junctions 210 and 230 so that the dual spin tunnel/valve structures 210 and 230 have some shape anisotropy, ensuring that the free layers 218 and 238 have a preferred direction. In addition, the thicknesses of the free layers 218 and 238 are low enough so that the spin transfer is strong enough to rotate the free layer magnetizations into alignment with the magnetizations of the pinned layers 212 and 222 and pinned layers 234 and 242. In a preferred embodiment, the free layers 218 and 238 have thicknesses of less than or equal to 10 nm. In addition, for the dual spin tunnel/valve structures 210 and 230 having the preferred dimensions, a sufficient current density on the order of $10^7$ Amps/cm$^2$ can be provided at a relatively small current. For example, a current density of approximately $10^7$ Amps/cm$^2$ can be provided with a current of approximately 0.5 mA for dual spin tunnel/valve structures 210 and 230 having an ellipsoidal shape of 0.06×0.12 m$^2$. As a result, the use of special circuitry for delivering very high currents may be avoided.

In addition to being configured to be written using spin transfer, the dual spin tunnel/valve structures 210 and 230 are preferably configured to have different median resistances and to be written using different currents. For example, the median resistances of the dual spin tunnel/valve structures 210 and 230 are R1 and R2, respectively. The resistance of the dual spin tunnel/valve structure 210 is R1−ΔR1 and R1+ΔR1 when the magnetization of the free layer 218 and the magnetization of the pinned layer 222 are parallel and antiparallel, respectively. The resistance of the spin tunneling junction 230 is R2−ΔR2 and R2+ΔR2 when the magnetization of the free layer 238 and the magnetization of the pinned layer 242 are parallel and antiparallel, respectively. In addition, the spin tunneling junction 210 is written using a current I1F in a forward direction from the top of the magnetic element 200 to the bottom of the magnetic element 200 and a current I1R in a reverse direction from the bottom of the magnetic element 200 to the top of the magnetic element 200. Similarly, the spin tunnel/valve structure 230 is written using a current I2F in a forward direction from the top of the magnetic element 200 to the bottom of the magnetic element 200 and a current I2R in a reverse direction from the bottom of the magnetic element 200 to the top of the magnetic element 200. In a preferred embodiment, I1F is greater than I2F and I1R is greater than I2R. Differences in the resistances and write currents for the dual spin tunnel/valve structures 210 and 230 can be achieved by tailoring of the layers in the dual spin tunnel/valve structures 210 and 230. For example, the free layer 218 and 238 could have different thicknesses. Similarly, the barrier layers 220 and 240 could have different thicknesses.

A connecting layer 202 resides between the dual spin tunnel/valve structures 210 and 230. The connecting layer 202 is preferably conductive. Thus, a current passing through the magnetic element 2100 in a CPP direction readily passes between the spin tunneling junctions 110 and 120. As a result, the same write current and read current used for one spin tunneling junction 210 can be used for the other spin tunneling junction 250. However, note that the read current is preferably less than any write current. Consequently, the direction of magnetization of the free layers 218 and 238 does not change during reading.

The magnetic element 200 can be written and read in essentially the same manner as the magnetic elements 100 and 100', for example using the methods 140 or 150. Consequently, the magnetic element 200 shares many of the same benefits as the magnetic elements 100 and 100'. Because of the presence of the additional pinned layers 214 and 234, which can also contribute to spin transfer, the current required to switch the magnetizations of the free layers 218 and 238 may be further reduced. Because the dual spin tunnel/valve structures 210 and 230 are used, and spin transfer exploited to write to the magnetic element, an external current producing an external switching magnetic field is no longer needed to write to the free layers 218 and 238 of the magnetic element 200. Instead, a current driven through the magnetic element 200 is used. As a result, there is less cross talk because a more localized switching mechanism is utilized, and less power consumed. The magnetic element 200 also has a significantly higher output signal when being read in a CPP configuration than a conventional spin valve because of the presence of the barrier layers (layers 220 and 240) of the magnetic element 200. Moreover, because the magnetic element 200 can be store multiple bits, the magnetic element 200 can be used in higher density memories.

Figure 5B:
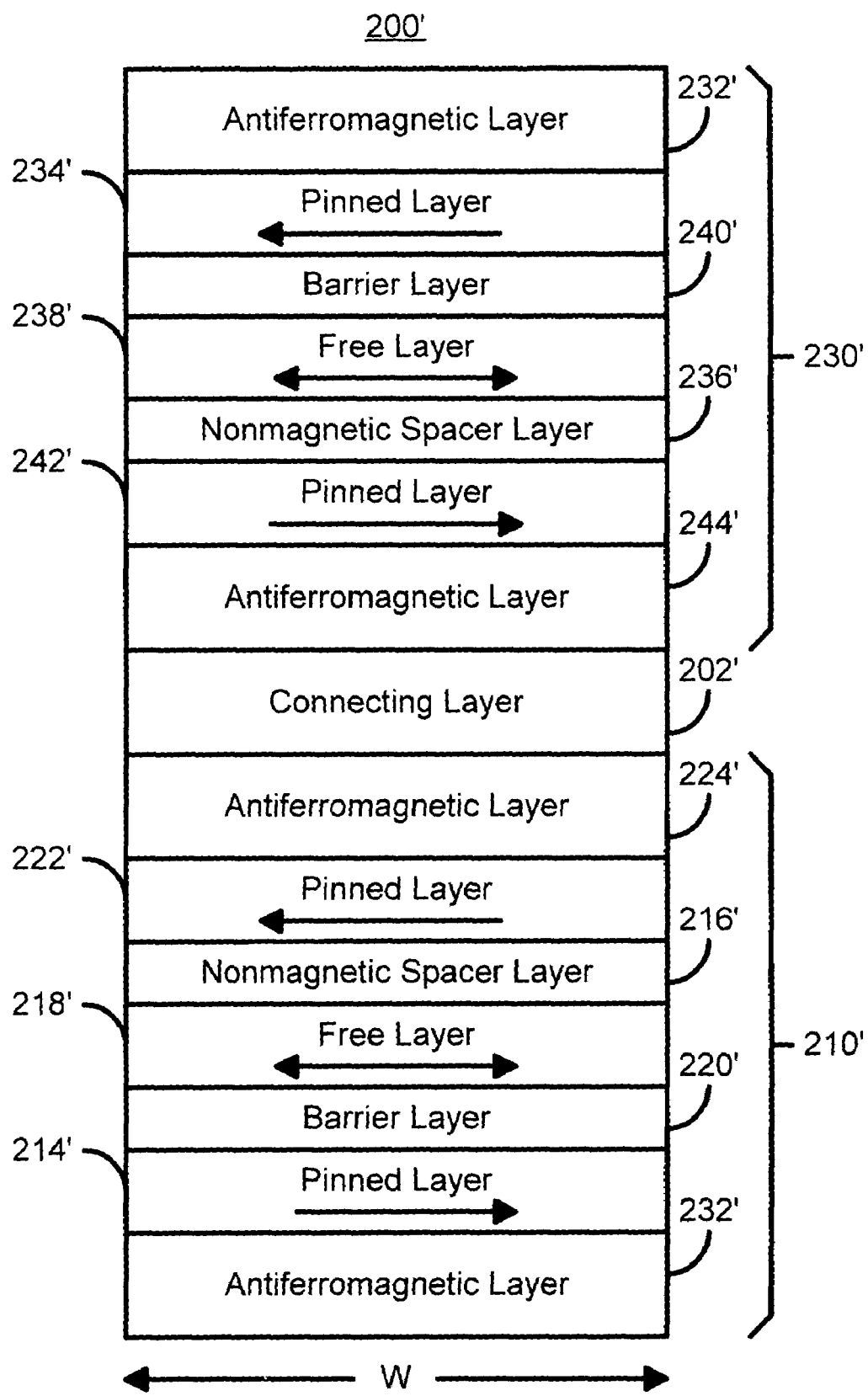
FIG. 5B is a diagram of a fourth embodiment of a magnetic element in accordance with the present invention capable of storing multiple bits, utilizing the spin transfer phenomenon for writing, and utilizing a dual spin tunnel/valve structure.

FIG. 5B is a diagram of a fourth embodiment of a magnetic element 200' in accordance with the present invention capable of storing multiple bits, utilizing the spin transfer phenomenon for writing, and utilizing a dual spin tunnel/valve structure. The magnetic element 200' is analogous to the magnetic element 200. Consequently, many of the components are labeled similarly. However, the positions of the nonmagnetic spacer layers 236' and 216' and barrier layers 220' and 240', respectively, have been reversed. However, the magnetic element 200' functions in substantially the same manner as the magnetic element 200. Consequently, the dual spin tunnel/valve structure 210' and 230' can be written by driving a current through the magnetic element 200' and exploiting spin transfer as described above. Thus, the magnetic element 200' has many of the same advantages as the magnetic element 200.

Figure 6A:
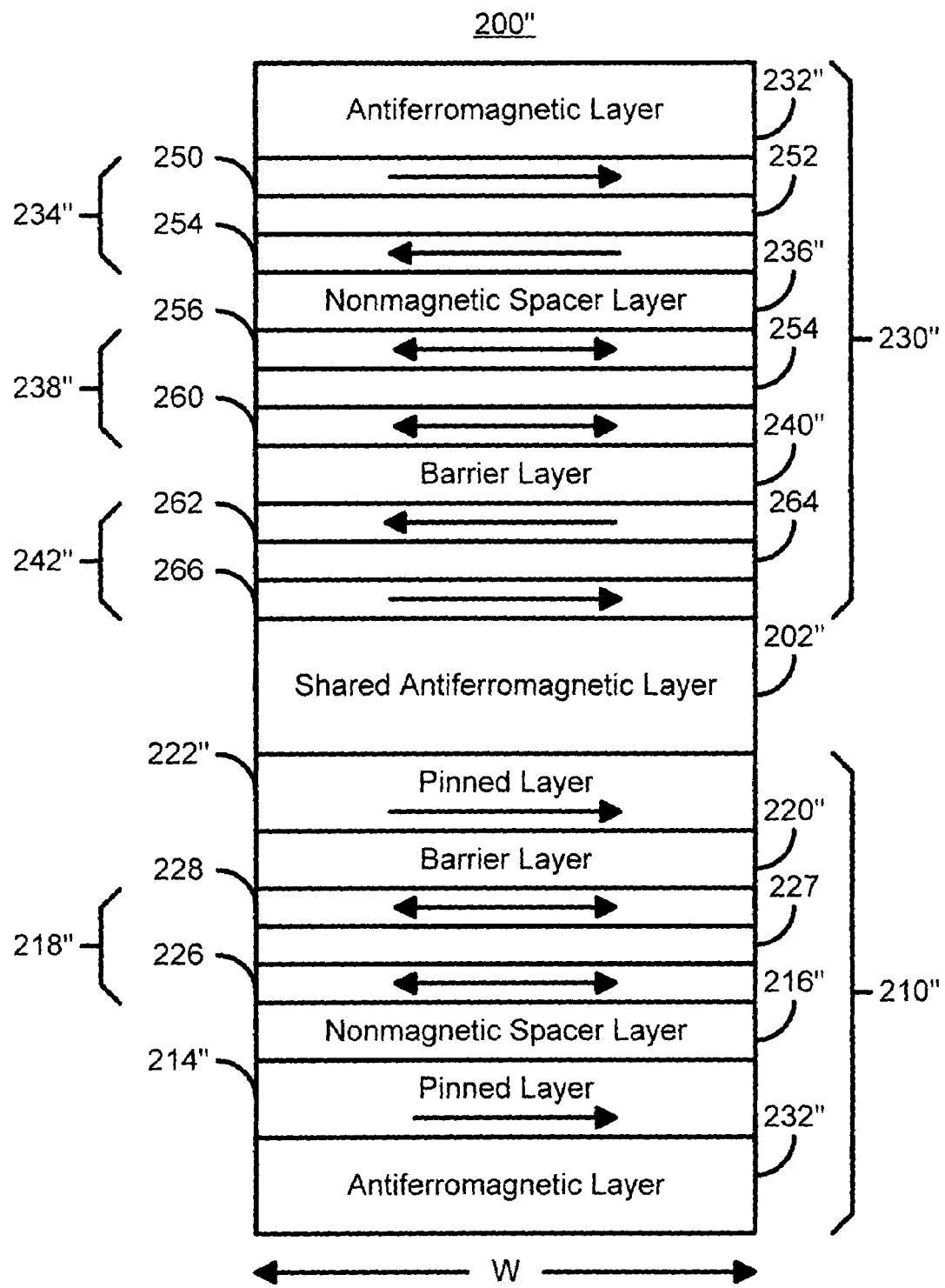
FIG. 6A is a diagram of a fifth, preferred embodiment of a magnetic element in accordance with the present invention capable of storing multiple bits, utilizing the spin transfer phenomenon for writing, and utilizing a dual spin tunnel/valve structure.
Figure 6B:
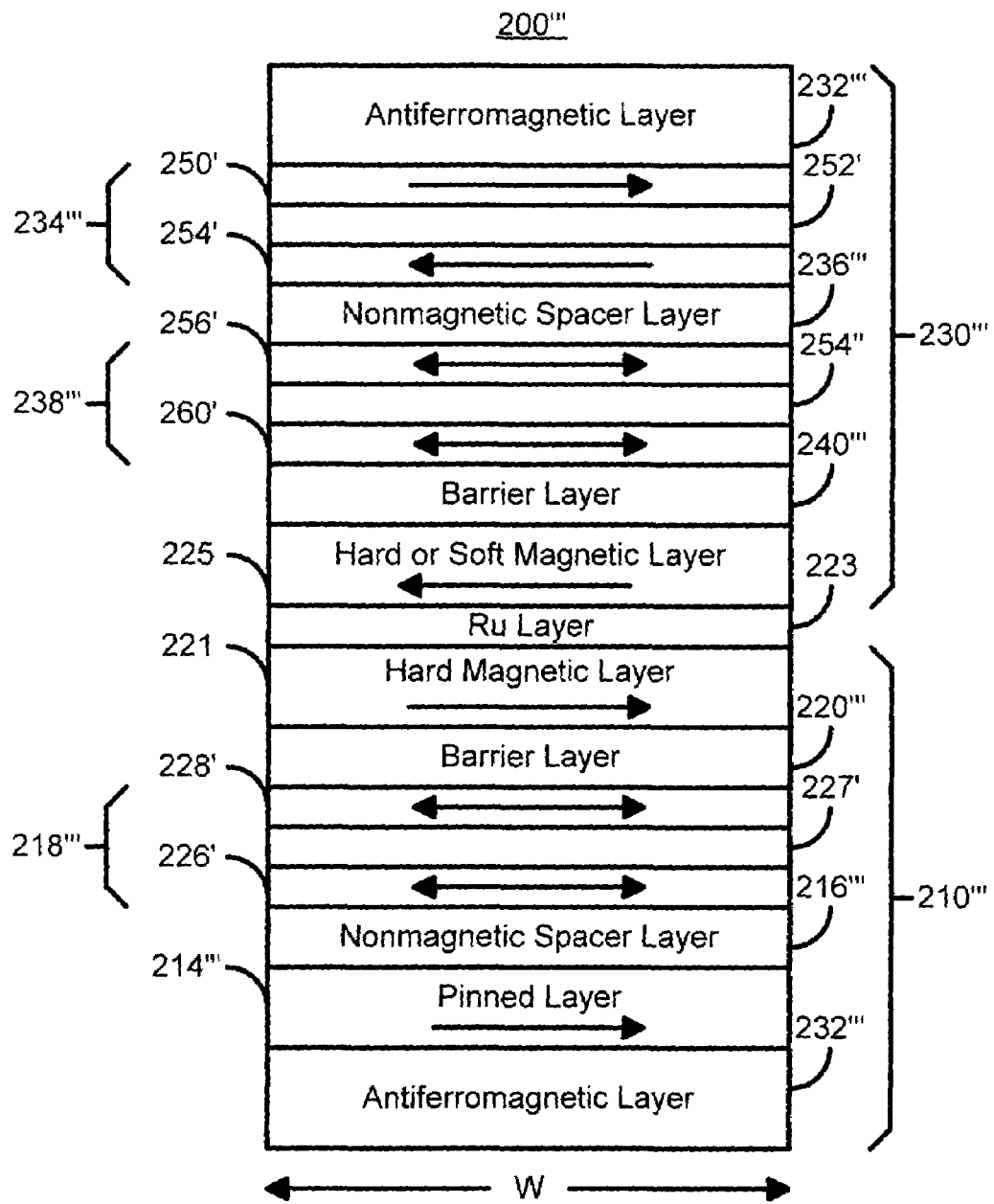
FIG. 6B is a diagram of an alternate version of the fifth, preferred embodiment of a magnetic element in accordance with the present invention capable of storing multiple bits, utilizing the spin transfer phenomenon for writing, and utilizing a dual spin tunnel/valve structure.

FIG. 6A is a diagram of a fifth, preferred embodiment of a magnetic element 200" in accordance with the present invention capable of storing multiple bits, utilizing the spin transfer phenomenon for writing, and utilizing dual spin tunnel/valve structures 210" and 230". However, the magnetic element 200" includes shared AFM layer 202". Thus, the separate AFM layers 224 and 232 and the separate connecting layer 202 of the magnetic elements 200 and 200' are omitted in favor of a single shared AFM layer 202". Consequently, the magnetic element 200" may have a shorter stack height. Alternatively, to further reduce stack's height, the pinned layers 222" and 242" and the shared AFM layer 202" can be replaced by an antiferromagnetically coupled hard magnetic layer/Ru/hard magnetic layer or hard magnetic layer/Ru/soft magnetic layer three-layer structure, where "hard" and "soft" refer to ferromagnetic layers with high and low magnetic anisotropy, respectively. The soft layer may be Co, Fe, Ni and their alloys; and the hard layer may be hard-magnet materials such as CoCrPt. Such an embodiment 200'" is depicted in FIG. 6B. The magnetic element 200'" has components that are analogous to the components as the magnetic element 200" depicted in FIG. 6A. Consequently, such components are labeled similarly. The magnetic element 200'" includes hard magnetic layers 221, Ru layer 223 and hard or soft magnetic layer 225 are used in lieu of the pinned layers 222" and 242" and AFM layer 202" of the magnetic element 200".

Furthermore, the magnetic element 200" includes synthetic free layers 218" and 238" as well as synthetic pinned layers 234" and 242". The synthetic free layer 218" includes magnetic layers 226 and 228 separated by nonmagnetic layer 227. The nonmagnetic layer 227 is preferably conductive and has a thickness configured so that the magnetic layers 226 and 228 are magnetically coupled to be antiferromagnetically aligned. The synthetic free layer 238" includes magnetic layers 256 and 260 separated by nonmagnetic layer 258. The nonmagnetic layer 258 is preferably conductive and has a thickness configured so that the magnetic layers 256 and 260 are magnetically coupled to be antiferromagnetically aligned. The synthetic pinned layer 234" includes magnetic layers 250 and 254 separated by nonmagnetic layer 252. The nonmagnetic layer 252 is preferably conductive and has a thickness configured so that the magnetic layers 250 and 254 are magnetically coupled to be antiferromagnetically aligned. The synthetic pinned layer 242" includes magnetic layers 262 and 266 separated by nonmagnetic layer 264. The nonmagnetic layer 264 is preferably conductive and has a thickness configured so that the magnetic layers 262 and 266 are magnetically coupled to be antiferromagnetically aligned. The synthetic pinned layer 234" and/or 242" have net moments opposite to the moments of the pinned layers 214" and 222".

In a preferred embodiment, the magnetic element 200" is configured to be written and read in substantially the same manner as the magnetic elements 200 and 200'. Thus, the dual spin tunnel/valve structures 210" and 230" have write currents I1F and I1R and write currents I2F and I2R, respectively. In addition the resistances of the dual spin tunnel/valve structures 210" and 230" differ. Preferably, the resistances of the dual spin tunnel/valve structure 210" are approximately R1−ΔR1 and R1+ΔR1 when the upper ferromagnetic layer 228 of the free layer 218" is aligned parallel and antiparallel, respectively, to the pinned layer 222". Similarly, the resistances of the dual spin tunnel/valve structure 230" are preferably approximately R2−ΔR2 and R2+ΔR2 when the lower ferromagnetic layer 260 of the free layer 238" is aligned parallel and antiparallel, respectively, to the upper layer 262 of the pinned layer 242". Thus, the four states of the magnetic element 200" correspond to the resistances R1−ΔR1+R2−ΔR2 ("00"), R1−ΔR1+R2+ΔR2 ("01"), R1+ΔR1+R2−ΔR2 ("10"), and R1+ΔR1+R2+ΔR2 ("11").

The magnetic element 200" can be written and read in essentially the same manner as the magnetic elements 100 and 100', for example using the methods 140 or 150. Consequently, the magnetic element 200 shares many of the same benefits as the magnetic elements 100 and 100'. Because the dual spin tunnel/valve structures 210" and 230" are used, and spin transfer exploited to write to the magnetic element, an external current producing an external switching magnetic field is no longer needed to write to the free layers 218" and 238" of the magnetic element 200". Instead, a current driven through the magnetic element 200" is used. As a result, there is less cross talk because a more localized switching mechanism is utilized, and less power consumed. The magnetic element 200" also has a significantly higher output signal when being read in a CPP configuration than a conventional spin valve because of the presence of the barrier layers (layers 220" and 240") of the magnetic element 200". Moreover, because the magnetic element 200" can be store multiple bits, the magnetic element 200" can be used in higher density memories.

Furthermore, because the free layers 218" and 238" are synthetic, their magnetizations may be easier to switch. Consequently, lower write currents may be used. In other words, the currents I1F, I2F, I1R, and I2R may be lower than for a single free layer. In addition, the pinned layers 222" and 242" across from the barrier can also contribute to spin transfer. In the preferred embodiment, the pinned layers 214" and 222" and the magnetic layers 254 and 262 are oriented to additively contribute the spin transfer effect for the free layers 218" and 238", respectively. Thus, the current required to switch the magnetizations of the free layers 218" and 238" may be further reduced. Consequently, the magnetic element 200" is suitable for use as a storage element in a higher density magnetic memory.

Similarly, the magnetic element 200'" shares many of the benefits of the magnetic element 200". In addition, because of the use of the layers 221, 223, and 225 in lieu of the pinned layers 222" and 242" and the AFM layer 202", the stack height of the magnetic element 200'" is further reduced. As a result, processing is simplified.

Figure 7:
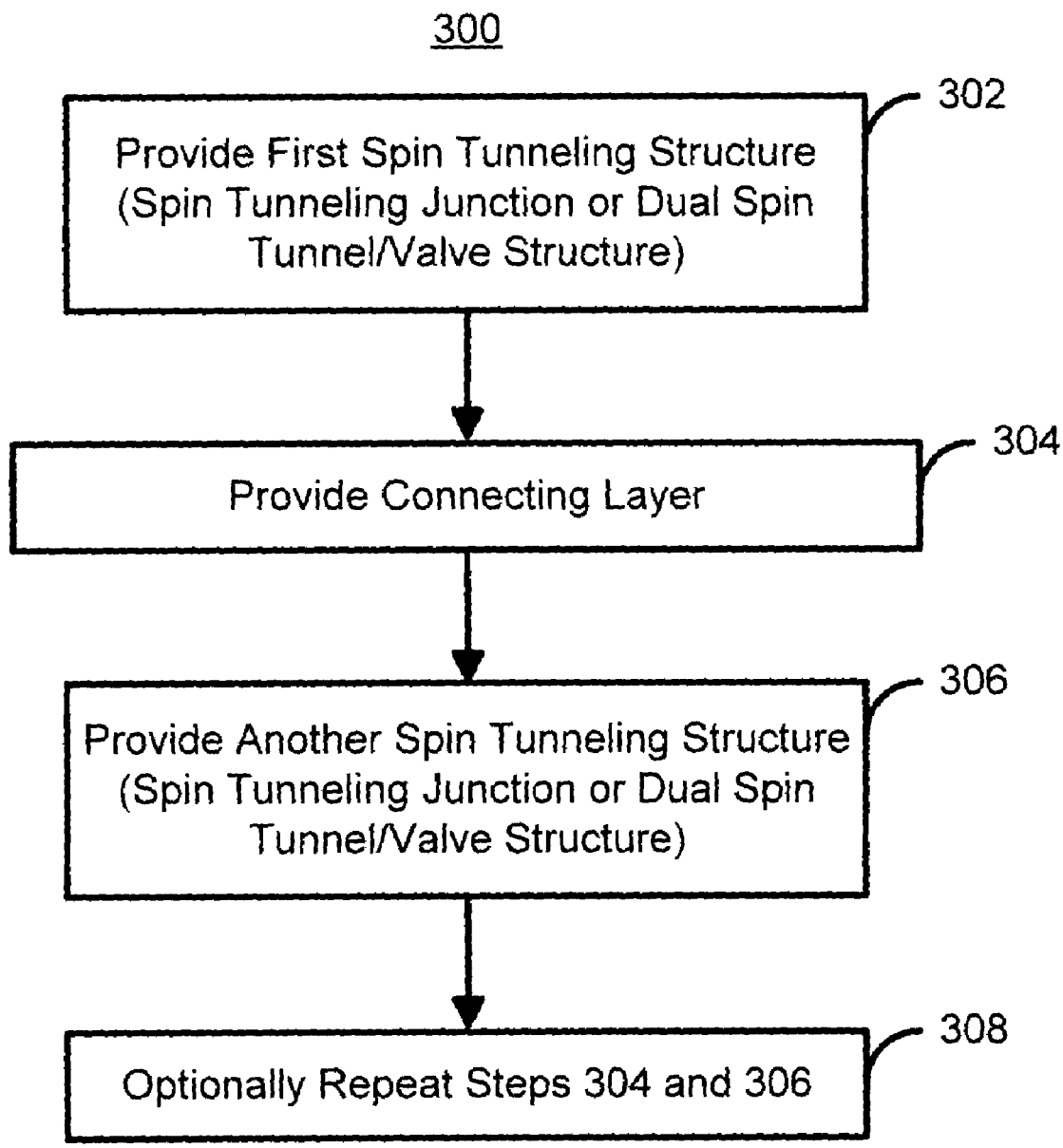
FIG. 7 depicts a high level flow chart of one embodiment of a method in accordance with the present invention for providing a magnetic element capable of storing multiple bits and utilizing the spin transfer phenomenon for writing.

FIG. 7 depicts a high level flow chart of one embodiment of a method 300 in accordance with the present invention for providing a magnetic element capable of storing multiple bits and utilizing the spin transfer phenomenon for writing. The method 300 is described in conjunction with the magnetic element 200" because the magnetic element 200" is the preferred magnetic element. However, the method 300 could be used for other magnetic elements such as the magnetic element 100, 100', 100", 200, and 200'.

A first structure is provided, via step 302. In a preferred embodiment, step 302 is used to provide a dual spin tunnel/valve structure such as the dual spin tunnel/valve structure 210". In another embodiment, the dual spin tunnel/valve structure 210, or the spin tunneling junction 110 or 110' is provided in step 302. Consequently, step 302 preferably includes providing a first pinned layer, a first nonmagnetic spacer layer, a first free layer, a first barrier layer, a first pinned layer, a connecting layer, a second pinned layer, a second barrier layer, a second free layer, a second nonmagnetic spacer layer, and a second pinned layer. Step 302 also preferably includes providing any seed layers and, in some embodiments, AFM layers adjacent to the pinned layers. A connecting layer is provided, via step 304. In a preferred embodiment, step 304 includes providing the shared AFM layer 202". However, in other embodiments, the connecting layer 202, 202', 102, or 102' can be provided. A second structure is provided, via step 306. The second structure is preferably the dual spin tunnel/valve structure 230". However, in another embodiment, the dual spin tunnel/valve structure 230 or 230' or the spin tunneling junction 120 or 120' are provided in step 306. Steps 304 and 306 can then be optionally repeated, via step 308. Thus, through step 308, more than two spin tunneling junctions and more than two dual spin tunnel/valve structures can be provided. Also, note that it is possible, though not preferred, to mix the types of structures provided in a magnetic element. For example, a magnetic element (not shown) could include a spin tunneling junction and a dual spin tunnel/valve structure separated by a connecting layer. In addition, although the method 300 separately provides the first and second structures, the method 300 could define the geometry of the first and second structures separately.

Figure 8:
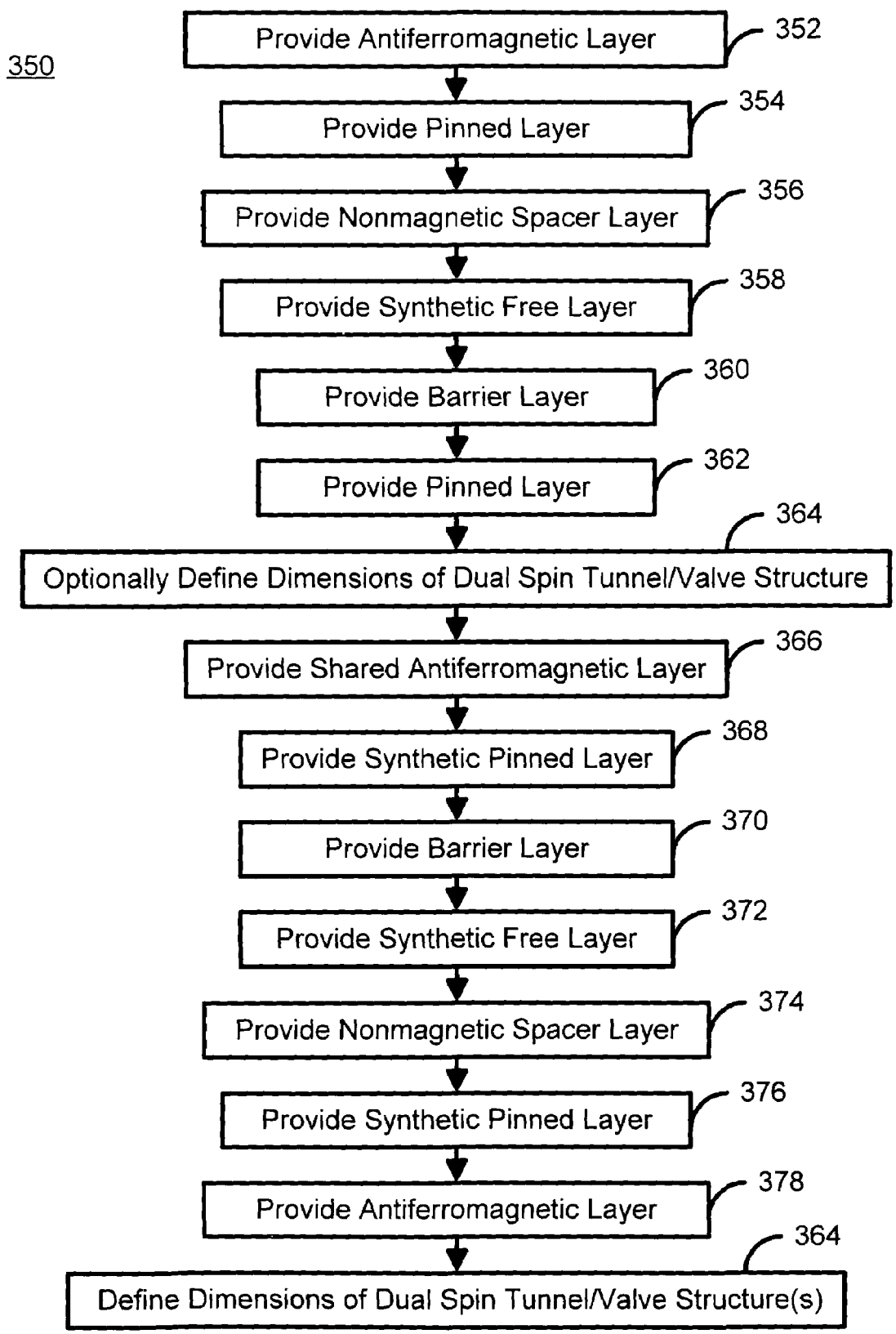
FIG. 8 is a more detailed flow chart of one embodiment of a method in accordance with the present invention for providing a magnetic element capable of storing multiple bits and utilizing the spin transfer phenomenon for writing.

FIG. 8 is a more detailed flow chart of one embodiment of a method 350 in accordance with the present invention for providing a magnetic element capable of storing multiple bits and utilizing the spin transfer phenomenon for writing. The method 350 is described in conjunction with the magnetic element 200" because the magnetic element 200" is the preferred magnetic element. However, the method 350 could be used for other magnetic elements such as the magnetic element 100, 100', 100", 200, and 200'. The AFM layer 212" is provided, preferably on a seed layer, via step 352. In a preferred embodiment, step 352 is performed using standard sputtering and the AFM material is preferably one hundred twenty Angstroms of PtMn. The pinned layer 214" is provided, via step 354. The pinned layer 214" is preferably sputtered Co, CoFe, other ferromagnetic alloys, or half metals. In a preferred embodiment, step 354, also includes providing a pinned layer that is approximately twenty Angstroms in thickness. The nonmagnetic spacer layer 216" is provided, via step 356. Step 356 may include providing a layer of copper that is between fifteen and forty Angstroms in thickness. However, another nonmagnetic conductor might be selected. The synthetic free layer 218" is provided, via step 358. Step 358 includes providing layers 226, 227, and 228. The magnetic layers 226 and 228 may include Co, Ni, Fe, their alloys, or half metals. The thicknesses of the magnetic layers 226 and 228 may be similar, for example they may be twenty five and thirty Angstroms or may both be twenty five Angstroms. Step 358 also includes providing the nonmagnetic layer 227 that allows for the magnetic layers 226 and 228 to be antiferromagnetically aligned. For example, the nonmagnetic layer 227 may be 8.5 Angstroms of Ru. The barrier layer 220" is provided, via step 360. Step 360 may include providing between ten and thirty Angstroms of alumina or other non-magnetic insulator. The pinned layer 222" is provided, via step 362. The step 362 can be similar to step 354. The dual spin tunnel/valve structure 210" can optionally be defined, for example using ion milling, via step 364. Thus, step 364 allows for the geometry of the dual spin tunnel/valve structure 210" to be defined separately from the dual spin tunnel/valve structure 230". However, in an alternate embodiment, step 364 may be omitted.

The shared AFM layer 202", or connecting layer, is provided, via step 366. The shared AFM layer 202" deposited in step 366 is preferably two hundred to three hundred angstroms of PtMn.

The synthetic pinned layer 242" is provided, via step 368. Step 368 includes providing layers 262, 264, and 266. The magnetic layers 262 and 266 may include Co, Ni, Fe, their alloys, or half metals. The thickness of the top magnetic layers 262 should be greater, for example thirty-five Angstroms, than the thickness of the bottom magnetic layer 266, for example fifteen Angstroms. The difference in thicknesses allows the magnetizations of the magnetic layers 262 and 266 to be set in the desired direction by the high-temperature anneal that sets the orientation of the AFM layer 232". Step 368 also includes providing the nonmagnetic layer 264 that allows for the magnetic layers 262 and 268 to be antiferromagnetically aligned. For example, the nonmagnetic layer 264 may be 8.5 Angstroms of Ru. The barrier layer 240" is deposited, via step 370. The step 370 may include providing less than ten Angstroms of alumina or other non-magnetic insulator. Thus, the thickness of the barrier layer 240" formed in step 360 is different from the thickness of the barrier layer 220" formed in step 370. As a result, the dual spin tunnel/valve structure 210" has a different resistance than the dual spin tunnel/valve structure 230", as is desired. The synthetic free layer 238" is provided, via step 372. Step 372 includes providing layers 256, 258, and 260. The magnetic layers 256 and 260 may include Co, Ni, Fe, their alloys, or half metals. The thicknesses and materials for the layers 256, 258, and 260 are selected so that the write currents I2F and I2R are different, and preferably less than, those of the free layer 218". The thicknesses of the magnetic layers 256 and 260 may be similar, for example they may be fifteen and seventeen Angstroms or may both be fifteen Angstroms. Step 372 also includes providing the nonmagnetic layer 258 that allows for the magnetic layers 256 and 260 to be antiferromagnetically aligned. For example, the nonmagnetic layer 258 may be 8.5 Angstroms of Ru.

The nonmagnetic spacer layer 236" is provided, via step 374. Step 374 preferably includes depositing twenty to forty Angstroms of copper. However, another nonmagnetic conducting material can be sued. For example, Ta, which has a lower interdiffusion with the pinned layer 234" and free layer 238" might be selected. The synthetic pinned layer 234" is provided, via step 376. Step 376 includes providing layers 250, 252, and 254. The magnetic layers 250 and 254 may include Co, Ni, Fe, their alloys, or half metals. The thickness of the bottom magnetic layers 254 should be greater, for example thirty-five Angstroms, than the thickness of the top magnetic layer 250, for example fifteen Angstroms. The difference in thicknesses allows the magnetizations of the magnetic layers 250 and 254 to be set in the desired direction by the high-temperature anneal that sets the orientation of the AFM layer 232". Consequently, the magnetization of the magnetic layer 254 is aligned with the magnetization of the magnetic layer 262 when fabrication is complete. Step 376 also includes providing the nonmagnetic layer 252 that allows for the magnetic layers 250 and 254 to be antiferromagnetically aligned. For example, the nonmagnetic layer 252 may be 8.5 Angstroms of Ru. The AFM layer 232" is provided, via step 378. Step 378 preferably includes providing one hundred and sixty Angstroms of PtMn. The dimensions of the dual spin tunnel/valve structure 230" may then be defined, via step 380. Step 380 is preferably performed using an ion milling step. In addition, in one embodiment, the dimensions of the dual spin tunnel/valve structure 210" may also be defined in step 380. In such an embodiment, step 364 is preferably omitted.

Using the method 300 and/or 350, magnetic elements capable of being written using spin transfer and capable of storing multiple bits are fabricated. Thus, the magnetic elements 100, 100', 200, 200', and 200" can be provided. Consequently, magnetic memories, such as MRAM, utilizing such magnetic elements 100, 100', 200', 200', and 200" can be fabricated. Because of the use of magnetic elements, such as magnetic elements 100, 100', 200', 200', and 200", the memories can be higher density, having less complex circuitry, and written using a more localized phenomenon.

The structures of the multibit magnetic element described above can also be used only to enhance the read signals, instead of increasing the number of bits stored per stack. When signal enhancement is desired, the stacks are written and read using only the lowest and highest resistance states. More specifically, for a two-bit stack, the lowest and highest resistance states are (00) and (11). If this two-bit stack is used for signal enhancement only, it becomes a one-bit stack whose read signal is the sum of the read signals of its two spin-transfer units.

A method and system has been disclosed for providing magnetic elements capable of storing multiple bits and being written using spin transfer. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic element capable of storing multiple bits comprising:
   a first pinned layer, the first pinned layer being ferromagnetic and having a first pinned layer magnetization, the first pinned layer magnetization being pinned in a first direction;
   a first nonmagnetic layer;
   a first free layer, the first nonmagnetic layer residing between the first pinned layer and the first free layer, the first free layer being ferromagnetic and having a first free layer magnetization;
   a connecting layer;
   a second pinned layer, the second pinned layer being ferromagnetic and having a second pinned layer magnetization pinned in a second direction, the connecting layer residing between the second pinned layer and the first free layer;
   a second nonmagnetic layer;
   a second free layer, the second nonmagnetic layer residing between the second pinned layer and the second free layer, the second free layer being ferromagnetic and having a second free layer magnetization;

wherein the magnetic element is configured to allow the first free layer magnetization and the second free layer magnetization to change direction due to spin transfer when a write current is passed through the magnetic element;

wherein the first free layer is configured to be written using a first write current having a first magnitude and a second write current having a second magnitude, the first write current in a first current direction, the second current in a second current direction, wherein the second free layer is configured to be written using a third current write current having a third magnitude and a fourth write current having a fourth magnitude, the third write current in the first current direction, the fourth write current in the second direction, the first magnitude being different from the third magnitude, the second magnitude being different the fourth magnitude.

2. The magnetic element of claim 1 wherein the connecting layer is an antiferromagnetic layer adjacent to the second pinned layer and the first pinned layer.

3. The magnetic element of claim 1 wherein the connecting layer, the first pinned layer, and the second pinned layer form a synthetic antiferromagnet including hard magnetic layer/Ru/hard magnetic layer or hard magnetic layer/Ru/soft magnetic layer.

4. The magnetic element of claim 1 further comprising:
an antiferromagnetic layer adjacent to the second pinned layer, the antiferromagnetic layer for pinning the second pinned layer magnetization in the second direction, the connecting layer being adjacent to and between the antiferromagnetic layer and the first free layer.

5. The magnetic element of claim 1 wherein the first free layer is a synthetic layer.

6. The magnetic element of claim 1 wherein the second free layer is a synthetic layer.

7. The magnetic element of claim 1 wherein the first pinned layer is a synthetic layer.

8. The magnetic element of claim 1 wherein the second pinned layer is a synthetic layer.

9. The magnetic element of claim 1 wherein the first nonmagnetic layer is an insulating barrier layer that allows charge carriers to tunnel between the first pinned layer and the first free layer.

10. The magnetic element of claim 1 wherein the second nonmagnetic layer is an insulating barrier layer that allows charge carriers to tunnel between the second pinned layer and the second free layer.

11. The magnetic element of claim 1 wherein the connecting layer is conductive.

12. The magnetic element of claim 1 further comprising:
a barrier layer; and
a third pinned layer, the barrier layer residing between the third pinned layer and the first free layer, the barrier layer allowing tunneling of charge carriers between the third pinned layer and the first free layer, the third pinned layer having a third pinned layer magnetization pinned in a third direction.

13. The magnetic element of claim 12 wherein the first direction is antiparallel to the third direction.

14. The magnetic element of claim 12 wherein the first free layer is a synthetic free layer.

15. The magnetic element of claim 14 wherein the first direction is parallel to the third direction.

16. The magnetic element of claim 12 further comprising:
a second barrier layer; and
a fourth pinned layer, the second barrier layer residing between the fourth pinned layer and the second free layer, the second barrier layer allowing tunneling of charge carriers between the fourth pinned layer and the second free layer, the fourth pinned layer having a fourth pinned layer magnetization pinned in a fourth direction.

17. The magnetic element of claim 16 wherein the second direction is antiparallel to the third direction.

18. The magnetic element of claim 17 wherein the first direction is parallel to the third direction.

19. The magnetic element of claim 16 wherein the second free layer is synthetic.

20. The magnetic element of claim 16 wherein the second pinned layer is synthetic.

21. The magnetic element of claim 16 wherein the third pinned layer is synthetic.

22. The magnetic element of claim 12 wherein the second nonmagnetic layer is conductive.

23. The magnetic element of claim 12 wherein the first magnitude is greater than the third magnitude.

24. The magnetic element of claim 12 wherein the second magnitude is greater than the fourth magnitude.

25. The magnetic element of claim 1 wherein the first nonmagnetic layer is conductive.

26. The magnetic element of claim 1 wherein the second nonmagnetic layer is conductive.

27. The magnetic element of claim 1 wherein the first magnitude is greater than the third magnitude.

28. The magnetic element of claim 1 wherein the second magnitude is greater than the fourth magnitude.

29. A magnetic element capable of storing multiple bits comprising:
a first dual spin tunnel/valve structure including a first pinned layer, a first nonmagnetic spacer layer, a first free layer, a first barrier layer, and a second pinned layer, the first nonmagnetic spacer layer residing between the first pinned layer and the first free layer, the first barrier layer residing between the first free layer and the second pinned layer;
a connecting layer; and
a second dual spin tunnel/valve structure including a third pinned layer, a second nonmagnetic spacer layer, a second free layer, a second barrier layer, and a fourth pinned layer, the second nonmagnetic spacer layer residing between the third pinned layer and the second free layer, the second barrier layer residing between the second free layer and the fourth pinned layer;
wherein the first dual spin tunnel/valve structure is configured to be written using a first write current having a first magnitude and a second write current having a second magnitude, the first write current in a first current direction, the second current in a second current direction and wherein the second dual spin tunnel/valve structure is configured to be written using a third current write current having a third magnitude and a fourth write current having a fourth magnitude, the third write current in the first current direction, the fourth write current in the second direction, the first magnitude being different from the third magnitude, the second magnitude being different the fourth magnitude.

30. The magnetic element of claim 29 wherein the magnetic element is configured to allow the first free layer magnetization and the second free layer magnetization to change direction due to spin transfer when a write current is passed through the magnetic element.

31. The magnetic element of claim 29 wherein the connecting layer is an antiferromagnetic for pinning the second pinned layer magnetization and the third pinned layer magnetization.

32. The magnetic element of claim 29 wherein the connecting layer, the second pinned layer, and the third pinned layer form a synthetic antiferromagnetic including magnetic layer/Ru/hard magnetic layer or soft magnetic layer/Ru/soft magnetic layer.

33. The magnetic element of claim 29 wherein the connecting layer is an antiferromagnetic for pinning the second pinned layer magnetization and the fourth pinned layer magnetization.

34. The magnetic element of claim 29 wherein the connecting layer is a synthetic antiferromagnetic hard/Ru/hard or soft/Ru/soft layer sandwiched between the second and fourth pinned layers.

35. The magnetic element of claim 29 wherein the first free layer is synthetic.

36. The magnetic element of claim 29 wherein the second free layer is synthetic.

37. The magnetic element of claim 29 wherein the first pinned layer is synthetic.

38. The magnetic element of claim 29 wherein the second pinned layer is synthetic.

39. The magnetic element of claim 29 wherein the third pinned layer is synthetic.

40. The magnetic element of claim 29 wherein the fourth pinned layer is synthetic.

41. The magnetic element of claim 29 wherein the first magnitude is greater than the third magnitude.

42. The magnetic element of claim 29 wherein the second magnitude is greater than the fourth magnitude.

43. A method for programming a magnetic element capable of storing multiple bits comprising the steps of:
if a first state is to be written, passing a first current through the magnetic element, the magnetic element including a first pinned layer, a first nonmagnetic layer, a first free layer, a connecting layer, a second pinned layer, a second nonmagnetic layer, and a second free layer, the first pinned layer being ferromagnetic and having a first pinned layer magnetization, the first pinned layer magnetization being pinned in a first direction, the first nonmagnetic layer residing between the first pinned layer and the first free layer, the first free layer being ferromagnetic and having a first free layer magnetization, the second pinned layer being ferromagnetic and having a second pinned layer magnetization pinned in a second direction, the connecting layer residing between the second pinned layer and the first free layer, the second nonmagnetic layer residing between the second pinned layer and the second free layer, the second free layer being ferromagnetic and having a second free layer magnetization, the magnetic element being configured to allow the first free layer magnetization and the second free layer magnetization to change direction due to spin transfer, the first current being sufficient to align the first free layer magnetization parallel to the first pinned layer magnetization and to align the second free layer magnetization parallel to the second pinned layer magnetization;
applying at least a second current through the magnetic element, the at least the second current leaves the first free layer magnetization parallel to the first pinned layer magnetization and aligning the second free layer magnetization antiparallel to the second pinned layer magnetization;
if a third state is to be written, applying at least a third current through the magnetic element, the at least the third current aligning the first free layer magnetization antiparallel to the first pinned layer magnetization and aligning the second free layer magnetization antiparallel to the second pinned layer magnetization; and
if a fourth state is to be written, after applying the first current, applying at least a fourth current through the magnetic element, the at least the fourth current leaves the first free layer magnetization antiparallel to the first pinned layer magnetization and aligning the second free layer magnetization parallel to the second pinned layer magnetization.

44. The method of claim 43 wherein the first free layer is configured to be written using a first write current in a first current direction and a second write current in a second current direction through the magnetic element, wherein the second free layer is configured to be written using a third write current in the first current direction and a fourth write current in the second current direction through the magnetic element, the third write current being less than the first write current, the fourth write current being less than the second write current, the first current being in the first current direction and being greater than the first write current and the third write current.

45. The method of claim 43 wherein the at least the second current includes a fifth current applied in the first current direction followed by a sixth current applied in the second current direction, the fifth current being greater than the first write current and the third write current, the sixth current being less than the second write current and greater than the fourth write current; wherein the at least the third current includes a seventh current in the second current direction followed by an eighth current in the first current direction, the seventh current being greater than the second write current and the fourth write current, the eighth current being less than the first write current and greater than the third write current; and
wherein the at least the fourth current includes a ninth current in the second current direction, the ninth current being greater than the second write current and the fourth write current.

46. A method for providing magnetic element capable of storing multiple bits comprising the steps of:
providing a first pinned layer, the first pinned layer being ferromagnetic and having a first pinned layer magnetization, the first pinned layer magnetization being pinned in a first direction;
providing a first nonmagnetic layer;
providing a first free layer, the first nonmagnetic layer residing between the first pinned layer and the first free layer, the first free layer being ferromagnetic and having a first free layer magnetization;
providing a connecting layer;
providing a second pinned layer, the second pinned layer being ferromagnetic and having a second pinned layer magnetization pinned in a second direction, the connecting layer residing between the second pinned layer and the first free layer;
providing a second nonmagnetic layer;
providing a second free layer, the second nonmagnetic layer residing between the second pinned layer and the second free layer, the second free layer being ferromagnetic and having a second free layer magnetization;
wherein the magnetic element is configured to allow the first free layer magnetization and the second free layer magnetization to change direction due to spin transfer when a write current is passed through the magnetic element;

wherein the first free layer is configured to be written using a first write current having a first magnitude and a second write current having a second magnitude, the first write current in a first current direction, the second current in a second current direction and wherein the second free layer is configured to be written using a third current write current having a third magnitude and a fourth write current having a fourth magnitude, the third write current in the first current direction, the fourth write current in the second direction, the first magnitude being different from the third magnitude, the second magnitude being different the fourth magnitude.

47. The method of claim 46 wherein the first pinned layer, the first free layer, the second pinned layer and the second free layer are defined in a single step.

48. The method of claim 46 wherein the first pinned layer and the first free layer are defined in a first step and the second pinned layer and the second free layer are defined in a second step separate from the first step.

49. The method of claim 46 further comprising the step of: providing an additional spin tunneling junction.

50. The method of claim 46 further comprising the step of: providing an additional dual spin tunnel/valve structure.

51. A method for providing a magnetic element capable of storing multiple bits comprising the steps of:

providing a first dual spin tunnel/valve structure including a first pinned layer, a first nonmagnetic spacer layer, a first free layer, a first barrier layer, and a second pinned layer, the first nonmagnetic spacer layer residing between the first pinned layer and the first free layer, the first barrier layer residing between the first free layer and the second pinned layer;

providing a connecting layer; and providing a second dual spin tunnel/valve structure including a third pinned layer, a second nonmagnetic spacer layer, a second free layer, a second barrier layer, and a fourth pinned layer, the second nonmagnetic spacer layer residing between the third pinned layer and the second free layer, the second barrier layer residing between the second free layer and the fourth pinned layer;

wherein the first dual spin tunnel/valve structure is configured to be written using a first write current having a first magnitude and a second write current having a second magnitude, the first write current in a first current direction, the second current in a second current direction and wherein the second dual spin tunnel/valve structure is configured to be written using a third current write current having a third magnitude and a fourth write current having a fourth magnitude, the third write current in the first current direction, the fourth write current in the second direction, the first magnitude being different from the third magnitude, the second magnitude being different the fourth magnitude.

52. The method of claim 51 wherein the first dual spin tunnel/valve structure and the second dual spin tunnel/valve structure are defined in a single step.

53. The method of claim 51 wherein the first dual spin tunnel/valve structure is defined in a first step and the second dual spin tunnel/valve structure are defined in a single step.

54. The method of claim 51 wherein the first dual spin tunnel/valve structure is configured to be written using a first write current and a second write current, the first write current in a first current direction, the second current in a second current direction and wherein the second dual spin tunnel/valve structure is configured to be written using a third current write current and a fourth write current, the third write current in the first current direction, the fourth write current in the second direction, the first write current, the second write current, the third write current and the fourth write current being different.

55. The method of claim 51 further comprising the step of:

providing a third dual spin tunnel/valve structure on the second dual spin tunnel/valve structure.

56. The method of claim 55 further comprising the step of:

providing a connecting layer between the second dual spin tunnel/valve structure and the third dual spin tunnel/valve structure.

* * * * *